United States Patent
Tada et al.

(10) Patent No.: US 9,059,082 B2
(45) Date of Patent: Jun. 16, 2015

(54) SEMICONDUCTOR DEVICE AND OPERATION METHOD FOR SAME

(75) Inventors: Munehiro Tada, Tokyo (JP); Makoto Miyamura, Tokyo (JP); Hiromitsu Hada, Tokyo (JP)

(73) Assignee: NEC Corporation, Tokyo (JP)

( * ) Notice: Subject to any disclaimer, the term of this patent is extended or adjusted under 35 U.S.C. 154(b) by 139 days.

(21) Appl. No.: 13/704,225

(22) PCT Filed: Jun. 9, 2011

(86) PCT No.: PCT/JP2011/063756
§ 371 (c)(1),
(2), (4) Date: Dec. 13, 2012

(87) PCT Pub. No.: WO2011/158887
PCT Pub. Date: Dec. 22, 2011

(65) Prior Publication Data
US 2013/0092895 A1    Apr. 18, 2013

(30) Foreign Application Priority Data

Jun. 16, 2010  (JP) ................................ 2010-136988

(51) Int. Cl.
*H01L 29/06*  (2006.01)
*H01L 27/24*  (2006.01)
(Continued)

(52) U.S. Cl.
CPC ........ *H01L 27/2436* (2013.01); *G11C 13/0007* (2013.01); *G11C 13/0014* (2013.01);
(Continued)

(58) Field of Classification Search
CPC . H01L 45/14; H01L 45/1266; H01L 45/1206; H01L 27/2472
USPC ........................ 257/8, 5; 326/39, 40; 365/103
See application file for complete search history.

(56) References Cited

U.S. PATENT DOCUMENTS

| 7,463,506 B2 | 12/2008 | Muraoka et al. |
| 7,989,924 B2 | 8/2011 | Sakamoto et al. |

(Continued)

FOREIGN PATENT DOCUMENTS

| JP | 2005-101535 A | 4/2005 |
| JP | 2006-032867 A | 2/2006 |

(Continued)

OTHER PUBLICATIONS

International Search Report in PCT/JP2011/063756 A1 dated Jul. 12, 2011 (English Translation Thereof).

(Continued)

*Primary Examiner* — Caridad Everhardt
(74) *Attorney, Agent, or Firm* — McGinn IP Law Group, PLLC

(57) ABSTRACT

A semiconductor device includes a first switching element, a second switching element, and at least one third switching element; wherein the third switching element includes a first terminal and a second terminal, wherein each of the first switching element and the second switching element includes an ion conductor, a first electrode which is disposed so as to have contact with the ion conductor and supplies metal ions to the ion conductor, and a second electrode which is disposed so as to have contact with the ion conductor and is less susceptible to ionization than the first electrode; and wherein
(a) the first electrode of the first switching element and the first electrode of the second switching element are electrically connected each other, and the first terminal of the third switching element is electrically connected to only the first electrodes which are electrically connected each other or
(b) the second electrode of the first switching element and the second electrode of the second switching element are electrically connected each other, and the first terminal of the third switching element is electrically connected to only the second electrodes which are electrically connected each other.

20 Claims, 17 Drawing Sheets

(51) Int. Cl.
  *G11C 13/00* (2006.01)
  *H01L 27/10* (2006.01)
  *H01L 45/00* (2006.01)

(52) U.S. Cl.
  CPC .......... *G11C13/003* (2013.01); *G11C 13/0069* (2013.01); G11C 2013/0073 (2013.01); *H01L 27/101* (2013.01); H01L 45/085 (2013.01); *H01L 45/1233* (2013.01); *H01L 45/1266* (2013.01); *H01L 45/14* (2013.01); *H01L 45/146* (2013.01); *H01L 27/2472* (2013.01)

(56) References Cited

U.S. PATENT DOCUMENTS

| 2005/0045919 | A1 | 3/2005 | Kaeriyama et al. | |
| 2006/0171224 | A1* | 8/2006 | Nejad et al. | 365/205 |
| 2007/0159867 | A1 | 7/2007 | Muraoka et al. | |
| 2007/0189059 | A1* | 8/2007 | Gogl | 365/153 |
| 2007/0217252 | A1* | 9/2007 | Symanczyk | 365/153 |
| 2008/0212259 | A1* | 9/2008 | Sakamoto et al. | 361/500 |
| 2008/0248380 | A1* | 10/2008 | Blanchard | 429/126 |
| 2009/0001348 | A1 | 1/2009 | Kaeriyama et al. | |
| 2009/0079009 | A1 | 3/2009 | Muraoka et al. | |
| 2010/0182821 | A1 | 7/2010 | Muraoka et al. | |
| 2011/0007554 | A1 | 1/2011 | Kaeriyama et al. | |
| 2011/0110150 | A1* | 5/2011 | Hanzawa et al. | 365/163 |
| 2012/0014165 | A1* | 1/2012 | Kozicki | 365/148 |

FOREIGN PATENT DOCUMENTS

| JP | 2006-319028 A | 11/2006 |
| JP | 2007-514265 A | 5/2007 |
| WO | WO 2005/066969 A1 | 7/2005 |
| WO | WO 2006/070683 A1 | 7/2006 |
| WO | WO 2006/070773 A1 | 7/2006 |
| WO | WO 2007/023569 A1 | 3/2007 |
| WO | WO 2009/084514 A1 | 7/2009 |

OTHER PUBLICATIONS

Shunichi Kaeriyama et al., "A Nonvolatile Programmable Solid-Electrolyte Nanometer Switch", IEEE Journal of Solid-State Circuits, vol. 40, No. 1, pp. 168-176, Jan. 2005.

Japanese Office Action dated Mar. 31, 2015, with a partial English translation.

* cited by examiner

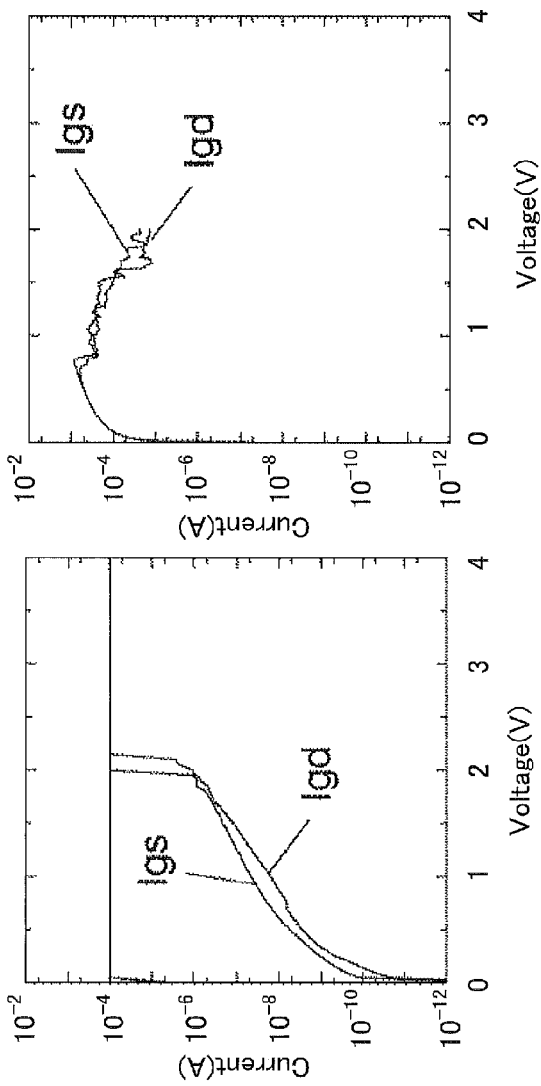

FIG. 27A
FIG. 27B
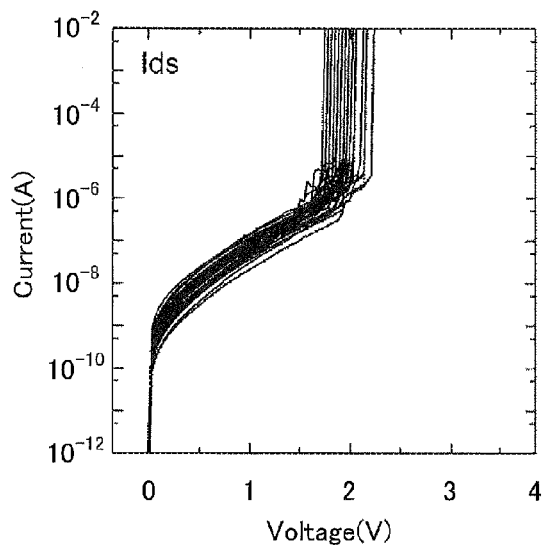
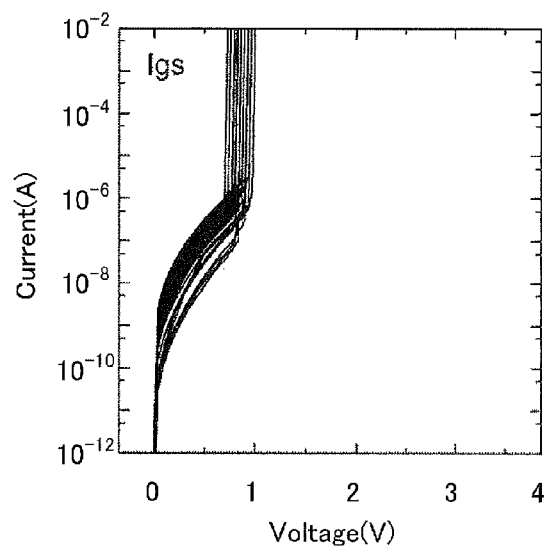
FIG. 28
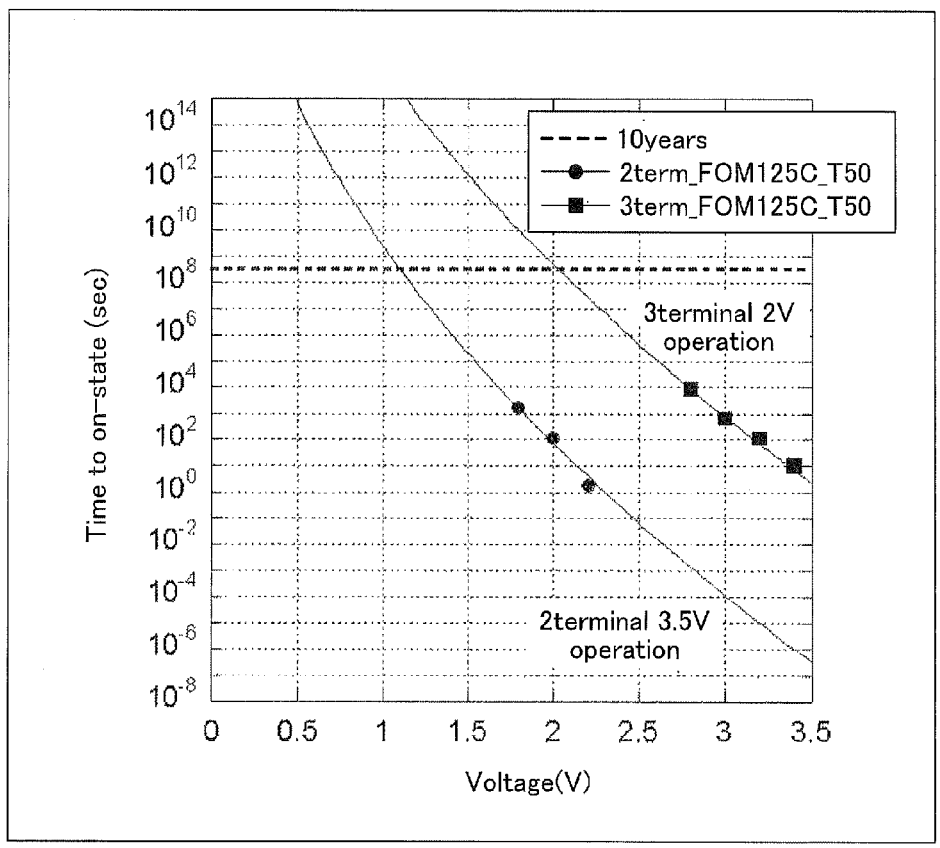

SEMICONDUCTOR DEVICE AND OPERATION METHOD FOR SAME

TECHNICAL FIELD

The present invention relates to a semiconductor device and an operation method for the same, and particularly relates to a semiconductor device and an operation method for the same which use a variable resistance type nonvolatile element.

BACKGROUND ART

The semiconductor device, especially the silicon device has been progressed in the large scale integration and the low power consumption through applying the miniaturization (scaling rule: Moore's rule), and has been developed in a pace of four times progress every three years. It is required to improve device performance through applying an approach different from the conventional scaling rule, because the gate length of MOSFET (Metal Oxide Semiconductor Field Effect Transistor) nowadays has become shorter than 20 nm, a cost of the lithography process rises suddenly, and there exists physical limit to the device size. The steep rise in the cost of the lithography process is, for example, a steep rise in the prices of an apparatus and a mask set. The physical limit to the device size is, for example, a limit to the operation and a limit due to the manufacturing deviation.

In order to improve the limit, in recent years, a programmable logic device which is rewritable and is called FPGA has been developed as an intermediate device between the gate array and the standard cell. FPGA makes it possible that, after a chip is manufactured, a customer configures a circuit through carrying out an electrical wiring on the chip arbitrarily. It is expected that the power consumption may be further lowered through using a variable resistance element inside a multi-layered wiring layer of FPGA. As the variable resistance element, there are ReRAM (Resistance Random Access Memory) using the transition metal oxide, Nano-Bridge (registered trademark by NEC Corporation) using the ion conductor and the like. Patent literature 1 and non-patent literature 1 disclose a variable resistance element using the mobility of the metal ion and the electrochemical reaction in the solid in which the metal ion can move freely by applying an electric field or the like. The solid, in which the ion can move freely by applying the electric field, is an ion conductor. The variable resistance element, which is disclosed in the patent literature 1 and the non-patent literature 1, includes an ion conducting layer, and a first electrode and a second electrode which are disposed on the opposite surfaces contacting with the ion conducting layer. The metal ion is supplied from the first electrode to the ion conducting layer, and the metal ion is not supplied from the second electrode. According to the variable resistance element which is disclosed in the patent literature 1 and the non-patent literature 1, a value of the electrical resistance is made to vary through changing polarity of an applied voltage and a state of conduction between two electrodes are controlled. Moreover, the patent literature 1 and the non-patent literature 1 disclose a crossbar switch which uses the variable resistance element in ULSI (Ultra-Large Scale Integration).

CITATION LIST

Patent Literature 1: Japanese Patent Application Laid-Open No. 2005-101535

Non-patent Literature 1: Shunichi Kaeriyama et al., "A Nonvolatile Programmable Solid-Electrolyte Nanometer Switch", IEEE Journal of Solid-State Circuits, Vol. 40, No. 1, pp. 168-176, January 2005.

DISCLOSURE OF INVENTION

Problem to be Solved by the Invention

However, the variable resistance element, which is described in the patent literature 1 and the non-patent literature 1, has the following problem. That is, in the case that the two terminals type variable resistance element, which is described in the patent literature 1 and the non-patent literature 1, is applied to the crossbar switch which is used on a signal line of ULSI, the problem arises that an erroneous writing is caused to the variable resistance element with a state of high electrical resistance by an amplitude of a signal which propagates through the adjacent switch. That is, an off disturbing problem arises. In particular, in the case that a programming voltage of the variable resistance element becomes lowered in order to make the programming voltage approach to an operating voltage of the logic LSI, the above-mentioned off disturbing problem becomes more remarkable. As a result, there is a problem that lowering the programming voltage improving the resistance to the off disturbing problem are not compatible each other. In other words, there is a problem that lowering the programming voltage and achieving high reliability are not compatible each other.

The object of the present invention is, solving the problem mentioned above, to provide a semiconductor device and an operation method for the same of which are able to achieve the high reliability and to lower the voltage.

Means for Solving Problem

In order to solve the problem mentioned above, a semiconductor device according to the present invention includes: a cell which includes a first switching element, a second switching element, and at least one third switching element; wherein the third switching element includes a first terminal and a second terminal, each of the first switching element and the second switching element includes an ion conductor, a first electrode which is disposed so as to have contact with the ion conductor and supplies metal ions to the ion conductor, and a second electrode which is disposed so as to have contact with the ion conductor and is less susceptible to ionization than the first electrode; and wherein (a) in the cell, the first electrode of the first switching element, the first electrode of the second switching element and the first terminal of the third switching element are electrically connected each other, or (b) in the cell, the second electrode of the first switching element, the second electrode of the second switching element, and the first terminal of the third switching element are electrically connected each other.

Moreover, an operation method for a semiconductor device which includes a first switching element, a second switching element, and at least one third switching element; wherein the third switching element includes a first terminal and a second terminal, each of the first switching element and the second switching element includes an ion conductor, a first electrode which is disposed so as to have contact with the ion conductor and supplies metal ions to the ion conductor, and a second electrode which is disposed so as to have contact with the ion conductor and is less susceptible to ionization than the first electrode;

(a) the first electrode of the first switching element and the first electrode of the second switching element are electrically connected each other, and a first terminal of the third switching element is electrically connected to only the first electrodes which are connected each other or (b) the second electrode of the first switching element and the second electrode of the second switching element are electrically connected each other, and a first terminal of the third switching element is electrically connected to only the second electrodes which are connected each other; the operation method for the semiconductor device including the steps of:

applying a predetermined voltage, which is higher than a voltage applied to the second electrodes of the first switching element and the second switching element, to the first electrode of the first switching element and the second switching element through the third switching element in the case of (a); and applying a predetermined voltage, which is lower than a voltage applied to the second electrodes of the first switching element and the second switching element, to the first electrodes of the first switching element and the second switching element through the third switching element in the case of (b).

Furthermore, an operation method for a semiconductor device, wherein the semiconductor device, including: a first switching element, a second switching element, and at least one third switching element; wherein the third switching element includes a first terminal and a second terminal, each of the first switching element and the second switching element includes an ion conductor, a first electrode which is disposed so as to have contact with the ion conductor and supplies metal ions to the ion conductor, and a second electrode which is disposed so as to have contact with the ion conductor and is less susceptible to ionization than the first electrode;

(a) the first electrode of the first switching element and the first electrode of the second switching element are electrically connected each other, and a first terminal of the third switching element is electrically connected to only the first electrodes which are connected each other or (b) the second electrode of the first switching element and the second electrode of the second switching element are electrically connected each other, and a first terminal of the third switching element is electrically connected to only the second electrodes which are connected each other; the operation method for the semiconductor device including the steps of:

applying a predetermined voltage, which is lower than a voltage applied to the second electrodes of the first switching element and the second switching element, to the first electrodes of the first switching element and the second switching element through the third switching element in the case of (a); and applying a predetermined voltage, which is higher than a voltage applied to the second electrodes of the first switching element and the second switching element, to the first electrode of the first switching element and the second switching element through the third switching element in the case of (b).

Effect of the Invention

According to the present invention, it is possible to realize the semiconductor device which can achieve the high reliability and perform low-voltage operation.

BRIEF DESCRIPTION OF THE DRAWINGS

FIG. 26A-26C show operation properties of the semiconductor device according to the example of the present invention.

FIG. 27A-27B show operation properties of the semiconductor device according to the example of the present invention.

FIG. 28 shows operation properties of a semiconductor device according to the background art and operation properties of the semiconductor device according to the example of the present invention.

DESCRIPTION OF EMBODIMENTS

The meaning of terminology related to the present invention will be described before describing the present invention in detail.
(Description of Bipolar Type Switching Element and Unipolar Type Switching Element)
(Unipolar Type Switching Element)

A unipolar type switching element means a switching element which switches between an OFF state and an ON state according to a level of an applied voltage. The OFF state means a state of high electrical resistance. The ON state means a state of low electrical resistance. The operation properties of the unipolar type switching element will be described with reference to FIG.1A-1D. FIG.1A-1D is a schematic diagram showing the operation properties of the unipolar type switching element.

Figure 1A:
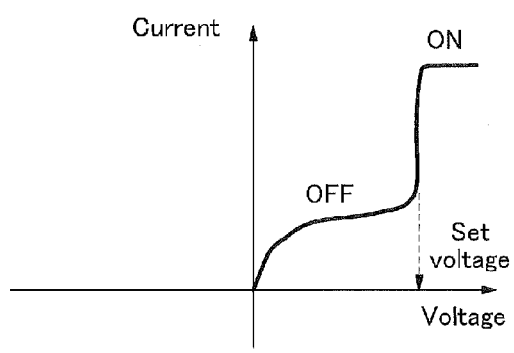
FIG. 1A-1D show operation properties of a unipolar type switching element.
Figure 1B:
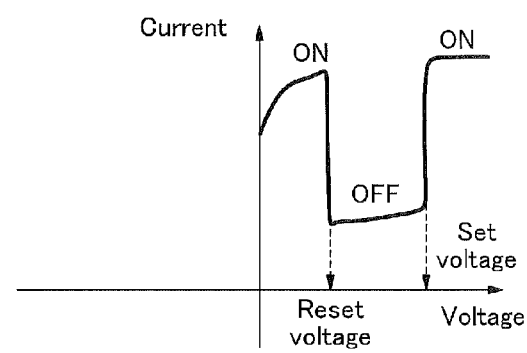

For example, in the case of a unipolar type variable resistance element which includes a first electrode, a switching element and a second electrode, if a positive voltage is applied to the first electrode (FIG. 1(A)), the switching element transits from the OFF state to the ON state with an intended set voltage used as a threshold voltage. That is, it transits from the state of high electrical resistance to the state of low electrical resistance. Here, the threshold voltage depends on a film thickness, composition, density, or the like of a variable resistance layer. Next, if the positive voltage is applied again to the first electrode of the switching element in the ON state (FIG. 1 (B)), the switching element transits from the ON state to the OFF state with an intended reset voltage used as a threshold voltage. If the positive voltage is applied continuously, it reaches a set voltage, and then the switching element transits from the OFF state to the ON state again.

On the other hand, if a negative voltage is applied to the first electrode (FIG. 1 (C)), the switching element transits from the OFF state to the ON state with an intended set voltage used as a threshold voltage. That is, it transits from the state of high electrical resistance to the state of low electrical resistance. Next, if the negative voltage is applied again to the first electrode of the switching element in the ON state (FIG. 1(D)), the switching element transits from the ON state to the OFF state with an intended reset voltage used as a threshold voltage.

Figure 1C:
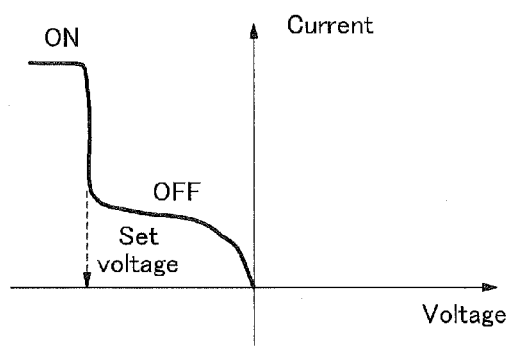
Figure 1D:
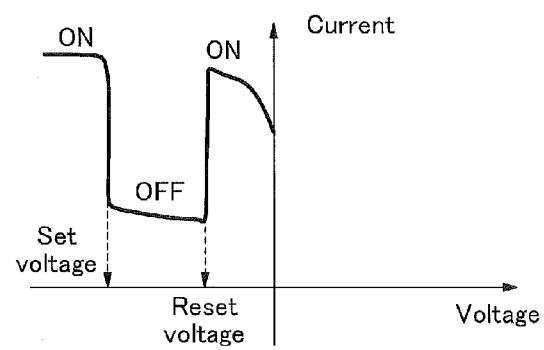

As mentioned above, the operation shown in FIGS. 1(A) to 1(B) and the operation shown in FIGS. 1(C) to 1(D) are symmetrical. The unipolar type switching element is defined as an element that has variable resistance properties independent of the direction of applying the voltage, that is, the polarity of the applied voltage and only dependent on the level of the applied voltage.
(Bipolar Type Switching Element) p A bipolar type switching element means a switching element which switches between an OFF state and an ON state according to a polarity of an applied voltage. The OFF state means a state of high electrical resistance. The ON state means a state of low electrical resistance. The operation properties of the bipolar type switching element will be described with reference to FIG.2A-2D. FIG.2A-2D are schematic diagram showing the operation properties of the bipolar type switching element.

Figure 2A:
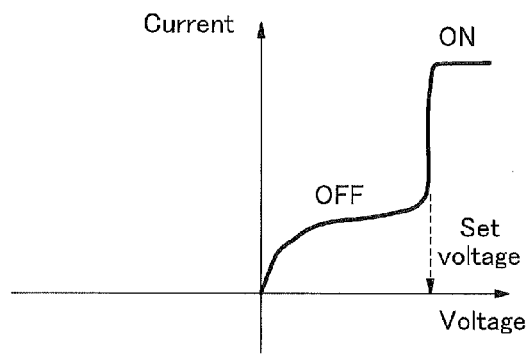
FIG. 2A-2D show operation properties of a bipolar type switching element.
Figure 2B:
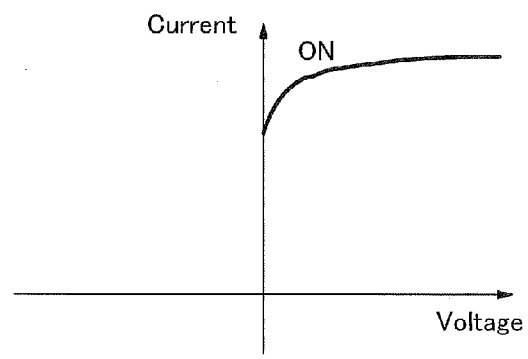
Figure 2C:
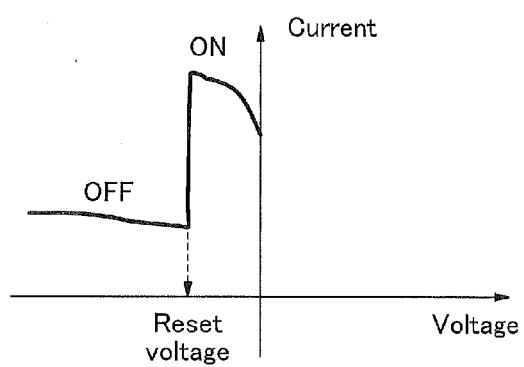
Figure 2D:
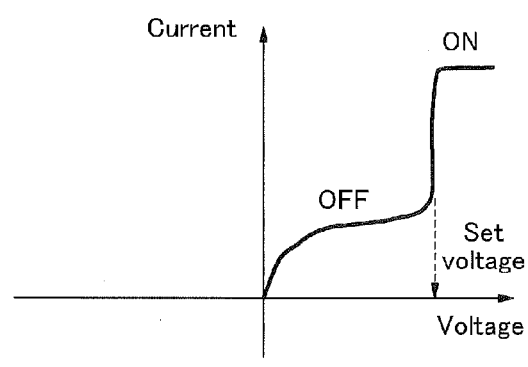

For example, in the case of the bipolar type switching element which includes a first electrode, an ion conductor and a second electrode, if a positive voltage is applied to the first electrode (FIG. 2(A)), the switching element transits from the OFF state to the ON state with an intended set voltage used as a threshold voltage. Next, if the positive voltage is applied again to the first electrode of the variable resistance element in the ON state (FIG. 2(B)), the switching element shows ohmic current versus voltage properties. Next, if a negative voltage is applied to the first electrode (FIG. 2(C)), the switching element transits from the ON state to the OFF state with an intended reset voltage used as a threshold voltage. That is, it transits from the state of low electrical resistance to the state of high electrical resistance. Furthermore, in the case that the positive voltage is applied again to the first electrode of the variable resistance element in the OFF state (FIG. 2(D)), the switching element transits from the OFF state to the ON state at an intended threshold voltage (set voltage). As mentioned above, it is defined as the bipolar type switching element is defined as an element that transits between the OFF state and the ON state according to the polarity of the applied voltage. In other words, the bipolar type switching element is defined as an element that transits between the state of high electrical resistance and the state of low electrical resistance according to the polarity of the applied voltage.
(Definition of Electrode Used in Bipolar Type Variable Resistance Element)

Here, an electrode, which is used in the bipolar type switching element, will be defined. As described in FIG. 2A-2D, in the case that the positive voltage is applied to an electrode and then the switching element transits from the OFF state to the ON state, the electrode is defined as the first electrode or an active electrode. On the other hand, in the case that the positive voltage is applied to an electrode and then the switching element transits from the ON state to the OFF state, the electrode is defined as the second electrode or an inactive electrode. The first electrode supplies an ion to the ion conductor, and the second electrode is less susceptible to ionization than the first electrode.

In the case of connecting two switching elements which are different each other, two electrodes are electrically connected each other. Then, a case, in which the active electrodes of the switching elements different each other or the inactive electrodes of the switching elements different each other are electrically connected each other or are unified, is defined as a connection between the electrodes which have the same polarity. On the other hand, a case, in which the active electrode in one of two switching elements which are different each other, and the inactive electrode in the other of them are connected, is defined as a connection between the electrodes which have the different polarities.

Hereinafter, exemplary embodiments and preferred examples according to the present invention will be described in detail using the bipolarity type switching element as the switching element.

<First Exemplary Embodiment>

Figure 3A:
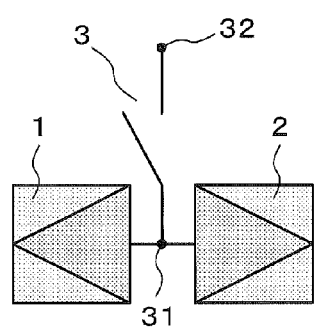
FIG. 3(A) is a circuit diagram showing a part of a semiconductor device according to an exemplary embodiment of the present invention.
Figure 3B:
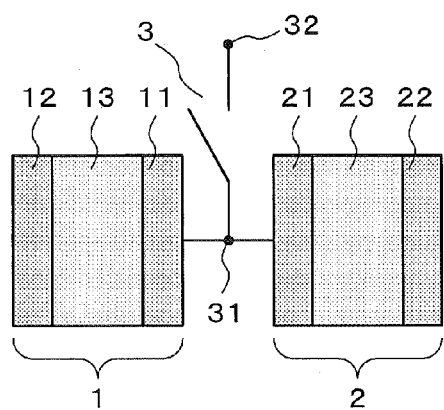
FIG. 3(B) is a cross section view showing a part of the semiconductor device according to the exemplary embodiment of the present invention.

FIG. 3(A) is a schematic diagram showing the constitution of a semiconductor device according to a first exemplary embodiment. FIG. 3(B) shows a structure of the semiconductor device, while FIG. 3(A) shows a circuit diagram of the semiconductor device. The semiconductor device shown in FIG. 3 (A) includes a first switching element 1, a second switching element 2, and at least one third switching element 3. The third switching element 3 includes first and second terminals 31 and 32. Each of the first and the second switching elements 1, 2 includes ion conductors 13, 23, first electrodes 11, 21 which are disposed contacting with the ion conductors 13, 23 and supplies the metal ion to the ion conductors 13, 23, and second electrodes 12, 22 which are disposed contacting with the ion conductors 13, 23 and are less susceptible to ionization than the first electrodes 11, 21, respectively. The first electrode 11 of the first switching element 1 and the first electrode 21 of the second switching element 2 are electrically connected each other, and the first terminal 31 of the third switching element 3 is electrically connected to only the first electrodes 11 and 21 which are connected each other. The semiconductor device shown in FIG. 3 (A) has the constitution mentioned above.

A material, which includes any one of an organic matter, organosiloxane, silicon carbide oxide, tantalum silicon oxide, tantalum oxide, zirconium oxide, hafnium oxide, silicon oxide and titanium oxide, is available for the ion conductor. Moreover, Cu-based material is available for the first electrode. A material, which includes Ru or Pt, is available for the second electrode. Here, Cu-based means that a Cu content rate is not smaller than 95%. Generally, if the Cu content rate becomes not larger than 95%, a wiring resistance increases.

The operation of the semiconductor device according to the first exemplary embodiment will be described below. States of the first switching element 1 and the second switching element 2 of the semiconductor device according to the present exemplary embodiment are programmed to set the state of high electrical resistance. Here, the state of high electrical resistance means a state that the ion is not conducted from the first electrode 11 of the first switching element 1 and the first electrode 21 of the second switching element 2 to the ion conductor 13 and the ion conductor 23, respectively. Then, a positive voltage, which is not higher than a threshold voltage (set voltage), is applied to the second electrode 12 of the first switching element 1, and the second electrode 22 of the second switching element 2 is grounded. As a result, the voltage is applied between both ends of each of the switching elements 1 and 2, while the voltage is applied to the second switching element 2 in the direction of transiting from the OFF state to the ON state, and the voltage is applied to the first switching element 1 in the direction of transiting from the ON state to the OFF state. That is, since the direction of applying the voltage to the second switching element 2 is coincident with the direction to make the second switching element 2 transit to the ON state, if a voltage not higher than the threshold voltage is applied, there is the potential for transiting to the ON state due to an erroneous operation. Meanwhile, since the direction of applying the voltage in the first switching element 1 is coincident with the direction of transiting to the OFF state, even if a voltage not higher than the threshold voltage is applied, the erroneous operation does not arise. Here, the transition to the ON state means that the ion is conducted from the first electrode 21 to the ion conductor 23. Meanwhile, the case will be taken into consideration below that a positive voltage, which is not higher than a threshold voltage (set voltage), is applied to the second electrode 22 of the second switching element 2 and the second electrode 12 of the first switching element 1 is grounded. In this case, the voltage is applied in the first switching element 1 in the direction of transiting from the OFF state to the ON state, and in contrast, the voltage is applied in the second switching element 2 in the direction of transiting from the ON state to the OFF state. That is, since the direction of applying the voltage in the first switching element 1 is coincident with the direction of transiting to the ON state, if a voltage not higher than the threshold voltage is applied, there is the potential for transiting to the ON state due to an erroneous operation. Meanwhile, since the direction of applying the voltage in the second switching element 2 is coincident with the direction of transiting to the OFF state, even if a voltage not higher than the threshold voltage is applied, the erroneous operation does not arise. Here, the transition to the ON state means that the ion is conducted from the first electrode 11 to the ion conductor 13.

As mentioned above, it is possible to maintain the OFF state in either the first switching element or the second switching element by the constitution according to the present exemplary embodiment, even if any signal form is transmitted. As a result, it is possible to eliminate the erroneous operation of transiting from the OFF state to the ON state, that is, to prevent the disturb failure. Therefore, it is possible to eliminate the imperfection due to the erroneous operation of the semiconductor circuit, and to realize the semiconductor device which has high reliability and can perform low-voltage operation. Moreover, since each of the voltages, which are applied to the first switching element and the second switching element is divided by each electrical resistance value of the first switching element and the second switching element into almost half voltage by resistor divider, it is possible to prevent the disturb failure.

(Modified Example According to the First Exemplary Embodiment)

Figure 4A:
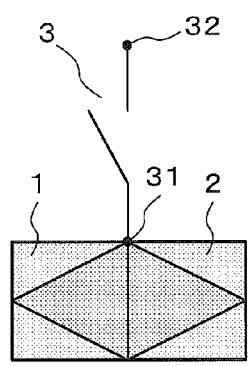
FIG. 4(A) is a circuit diagram showing an example of the semiconductor device according to the exemplary embodiment of the present invention.
Figure 4B:
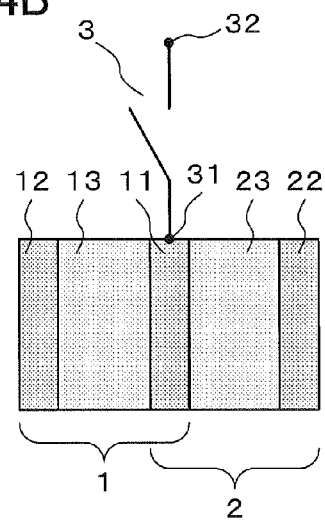
FIG. 4(B) is a cross section view showing an example of the semiconductor device according to the exemplary embodiment of the present invention.
Figure 5:
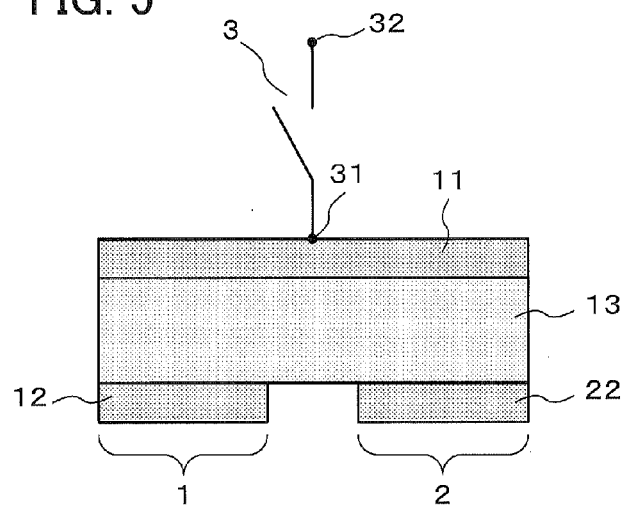
FIG. 5 is a cross section view showing an example of the semiconductor device according to the exemplary embodiment of the present invention.

FIG. 4(A) is a modified example of the semiconductor device shown in FIG. 3(A). FIG. 4(B) shows the structure of the semiconductor device, while FIG. 4(A) shows a circuit diagram of the semiconductor device. As shown in FIG. 4(A), it is possible to unify the first electrode 11 of the first switching element 1 with the first electrode 21 of the second switching element 2. Because of the constitution, it becomes possible to miniaturize the semiconductor device, and to reduce transmission loss of a control signal. Moreover, it is also possible to unify the ion conductor 13 of the first switching element 1 with the ion conductor 23 of the second switching element 2 as shown in FIG. 5 as long as the first electrodes of the first switching element and the second switching element are electrically connected each other.

<Second Exemplary Embodiment>

(Programming Method of Switching Element)

Figure 6:
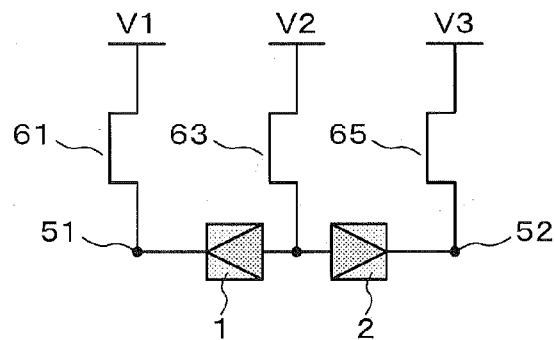
FIG. 6 is a circuit diagram showing an example of the semiconductor device according to the exemplary embodiment of the present invention.

The method for programming the switching element according to the first exemplary embodiment will be described below. FIG. 6 is a schematic diagram showing a semiconductor device according to the second exemplary embodiment. As shown in FIG. 6, first electrodes of a first switching element 1 and a second switching element 2, and a drain of a first transistor 63 are electrically connected each other. Here, the first electrode 11 of the first switching element 1 and the first electrode 21 of the second switching element 2 are the active electrodes. A drain of a second transistor 61 is electrically connected to the second electrode 12 of the first switching element 1. Here, the second electrode 12 of the first switching element 1 is the inactive electrode. And a drain of a third transistor 65 is electrically connected to the second electrode 22 of the second switching element 2.

For example, if an electric signal is transmitted from a terminal 51 to a terminal 52, it is necessary to make both of the first switching element 1 and the second switching element 2 transit to the ON state, that is, the state of low electrical resistance. In this case, it is possible to realize the intended transition to the ON state by grounding a terminal V1 and a terminal V3, by applying to a terminal V2 a predetermined voltage, that is, a positive voltage which is not lower than a threshold voltage (set voltage) of the switching element, and consequently by making the second transistor 61, the first transistor 63 and the third transistor 65 transit to the state of low electrical resistance. On the other hand, in the case of cutting off an electrical signal transmitting from the terminal 51 to the terminal 52, it is necessary to make both of the first switching element 1 and the second switching element 2 transit to the OFF state, that is, the state of high electrical resistance. In this case, it is possible to realize the intended transition to the OFF state by grounding the terminal V2, by applying to the terminals V1 and V3 a positive voltage which is not lower than a threshold voltage (reset voltage) of the switching element, and consequently by making the second transistor 61, the first transistor 63 and the third transistor 65 transit to the state of low electrical resistance.

It is not necessary that the predetermined voltage is higher than the threshold voltage. It is also possible to make the state of the switching element transit over time by applying a voltage, which is lower than the threshold voltage for a long time, for example.

<Third Exemplary Embodiment>
(Rewriting Circuit 1 Using P Type MIS and N Type MIS)

Figure 7:
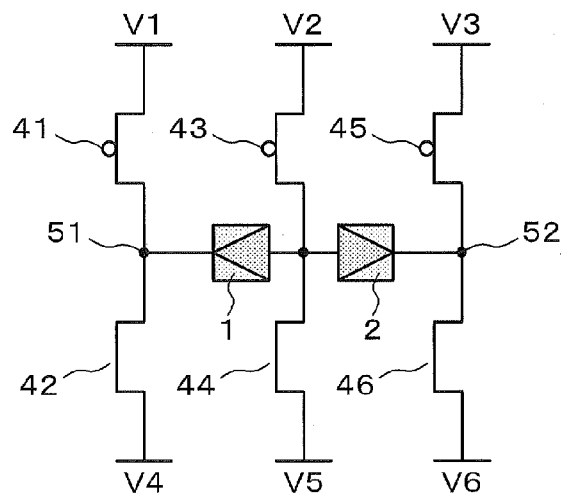
FIG. 7 is a circuit diagram showing an example of the semiconductor device according to the exemplary embodiment of the present invention.

A semiconductor device according to a third exemplary embodiment is the same as the semiconductor device according to the second exemplary embodiment except that a programming method of the switching element is different from that of the second exemplary embodiment. FIG. 7 is a schematic diagram showing the semiconductor device according to the third exemplary embodiment. As shown in FIG. 7, a first electrode of a first switching element 1 and a first electrode of a second switching element 2, a drain of a first P type MIS (Metal Insulator Semiconductor) transistor 43 and a drain of a first N type MIS transistor 44, are electrically connected each other, respectively. Here, the first electrode 11 of the first switching element 1 and the first electrode 21 of the second switching element 2 are the active electrodes. A drain of a second P type MIS transistor 41 and a drain of a second N type MIS transistor 42 are electrically connected to the second electrode 12 of the first switching element 1. Here, the second electrode 12 of the first switching element 1 is the inactive electrode. A drain of a third P type MIS transistor 45 and a drain of a third N type MIS transistor 46 are electrically connected to the second electrode 22 of the second switching element 2.

The operation will be described below. By putting the MIS transistors 41, 42, 45 and 46 into the state of low electrical resistance, and putting the MIS transistors 43 and 44 into the state of high electrical resistance, both of the first switching element 1 and the second switching element 2 are put into the state of high electrical resistance. Then, similarly to the second exemplary embodiment, a positive voltage which is not higher than a threshold voltage (set voltage) is applied through the terminal 51, and the terminal 52 is grounded. As a result, while the voltage is applied between both ends of each of switching elements 1 and 2, the first switching element 1 does not malfunction even if a voltage not higher than the threshold voltage is applied, because the direction of applying the voltage to the first switching element 1 is coincident with the direction for the first switching element 1 to transit to the OFF state. On the other hand, in the case that a positive voltage which is not higher than the threshold voltage (set voltage) is applied to the terminal 52, and the terminal 51 is grounded, since the direction of applying the voltage to the second switching element 2 is coincident with the direction for the second switching element 2 to transit to the OFF state, the second element 2 does not malfunction, even if a voltage which is not higher than the threshold voltage is applied.

As mentioned above, it is possible to maintain the OFF state of either the first switching element or the second switching element by the constitution according to the present exemplary embodiment, even if any signal form is transmitted. As a result, it is possible to prevent the erroneous operation of transiting from the OFF state to the ON state, that is, the disturb failure. Therefore, by the constitution mentioned above, it is possible to eliminate the imperfection due to the erroneous operation of the semiconductor circuit, and to realize the semiconductor device which has high reliability and can perform low-voltage operation. As the typical MIS transistor, a MOS (Metal Oxide Semiconductor) transistor can be used. And, by connecting a P type MOS transistor to a power supply, and connecting an N type MOS transistor to the ground, it is possible to obtain intended performance. For example, if the N type MOS transistor is connected to the power source, a source of the transistor becomes floating, and consequently the performance is degraded.

(Rewriting Circuit 2 Using P Type MIS and N Type MIS)

Figure 8:
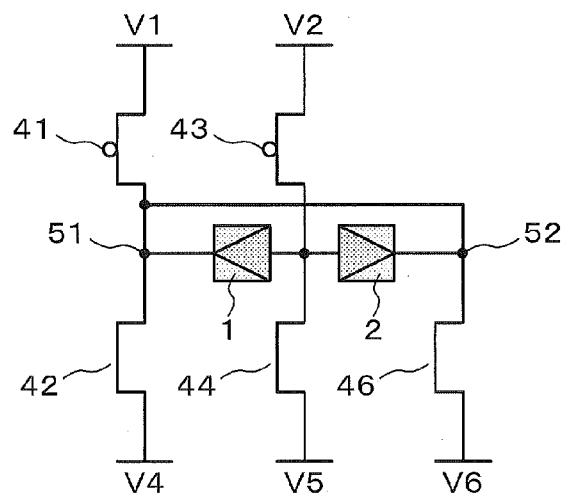
FIG. 8 is a circuit diagram showing an example of the semiconductor device according to the exemplary embodiment of the present invention.

A semiconductor device shown in FIG. 8 has a constitution in which the third P type MIS transistor 45 is omitted in the semiconductor device shown in FIG. 7.

As shown in FIG. 8, the first electrode of the first switching element 1 and the first electrode of the second switching element 2, the drain of the first P type MIS transistor 43 and the drain of the first N type MIS transistor 44, are electrically connected each other, respectively. The drain of the second P type MIS transistor 41 is connected to both of the second electrode 12 of the first switching element 1 and the second electrode 22 of the second switching element 2. The drain of the second P type MIS transistor 41 and the drain of the second N type MIS transistor 42 are electrically connected to the second electrode 12 of the first switching element 1. The drain of the third N type MIS transistor 46 is electrically connected to the second electrode 22 of the second switching element 2.

By the composition, the number of the transistors becomes smaller than that of the semiconductor device shown in FIG. 7, and it is possible to realize the fine and simple semiconductor device.

Similarly, it is also possible to omit the second P type MIS transistor 41 and to electrically connect the drain of the third P type MIS transistor 45 to both the second electrode 12 of the first switching element and the second electrode 22 of the second switching element 2. As the typical MIS transistor, a MOS (Metal Oxide Semiconductor) transistor can be used.

<Fourth Exemplary Embodiment>

Figure 9A:
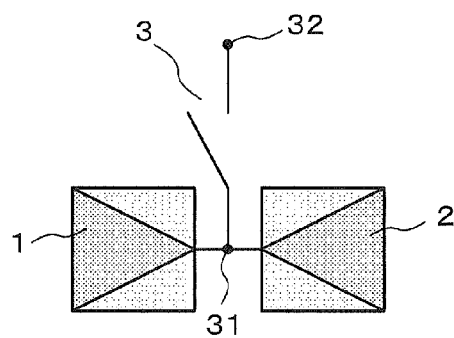
FIG. 9(A) is a circuit diagram showing a part of the semiconductor device according to the exemplary embodiment of the present invention.
Figure 9B:
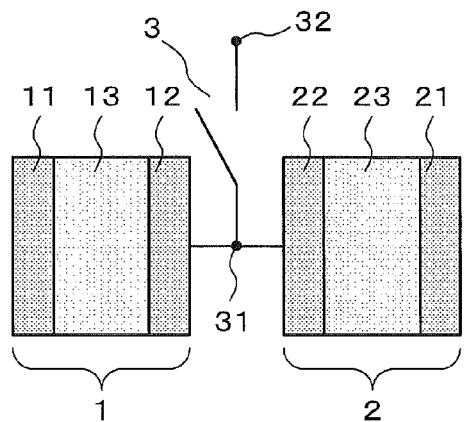
FIG. 9(B) is a cross section view showing a part of the semiconductor device according to the exemplary embodiment of the present invention.

A semiconductor device according to a fourth exemplary embodiment has a constitution in which the second electrodes of the first and the second switching elements instead of the first electrodes thereof are electrically connected each other in the semiconductor device according to the first exemplary embodiment. FIG. 9(A) is a schematic diagram showing the constitution of the semiconductor device according to the fourth exemplary embodiment. FIG. 9(B) shows the structure of the semiconductor device, while FIG. 9(A) shows a circuit diagram of the semiconductor device. The semiconductor device shown in FIG. 9(A) includes the first switching element 1, the second switching element 2, and at least one of third switching elements 3. The third switching element 3 includes the first terminal 31 and the second terminal 32. Each of the first and the second switching elements 1, 2 includes the ion conductor 13, 23, the first electrode 11, 21 which is disposed contacting with the ion conductor 13, 23 and supplies the metal ion to the ion conductor 13, 23, and the second electrode 12, 22 which is disposed contacting with the ion conductor 13, 23 and is less susceptible to ionization than the first electrode 11, 21, respectively. The second electrode 12 of the first switching element 1 and the second electrode 22 of the second switching element 2 are electrically connected each other, and the first terminal 31 of the third switching element 3 is electrically connected to only the second electrodes 12 and 22 which are connected each other. The semiconductor device shown in FIG. 9(A) has the constitution mentioned above.

The operation of the semiconductor device according to the fourth exemplary embodiment will be described below. States of the first switching element 1 and the second switching element 2 in the semiconductor device according to the present exemplary embodiment are programmed to set the state of high electrical resistance. And then, a positive voltage which is not higher than a threshold voltage (set voltage) is applied to the first electrode 11 of the first switching element 1, and the first electrode 21 of the second switching element 2 is grounded. In this case, since the direction of applying the voltage to the first switching element 1 is coincident with the direction of transiting to the ON state, if a voltage not higher than the threshold voltage is applied, there is the potential for transiting to the ON state due to an erroneous operation. On the other hand, since the direction of applying the voltage to the second switching element 2 is coincident with the direction of transiting to the OFF state, the erroneous operation does not arise, even if a voltage not higher than the threshold voltage is applied. Here, the transition to the ON state means that the ion is conducted from the first electrode 11 to the ion conductor 13. Meanwhile, the case will be taken into consideration below that a positive voltage which is not higher than a threshold voltage (set voltage) is applied to the first electrode 21 of the second switching element 2, and the first electrode 11 of the first switching element 1 is grounded. In this case, since the direction of applying the voltage to the second switching element 2 is coincident with the direction of transiting to the ON state, if a voltage not higher than the threshold voltage is applied, there is the potential for the second switching element 2 transiting to the ON state due to the erroneous operation. On the other hand, since the direction of applying the voltage to the first switching element 1 is coincident with the direction of transiting to the OFF state, the erroneous operation does not arise, even if a voltage not higher than the threshold voltage is applied. Here, the transition to the ON state means that the ion is conducted from the first electrode 21 to the ion conductor 23.

As mentioned above, the constitution in which the second electrodes are connected each other has the same effect as the constitution in which the first electrodes are connected each other does. That is, since it is possible to maintain the OFF state of either the first switching element or the second switching element even if any signal form is transmitted, it is possible to prevent the disturb failure. Furthermore, it becomes possible to miniaturize the semiconductor device because according to the constitution connecting the second electrodes each other, the first electrode and the wiring layer can be unified when the constitution is realized in the multilayered wiring layer.

(Modified Example of Fourth Exemplary Embodiment)

Figure 10A:
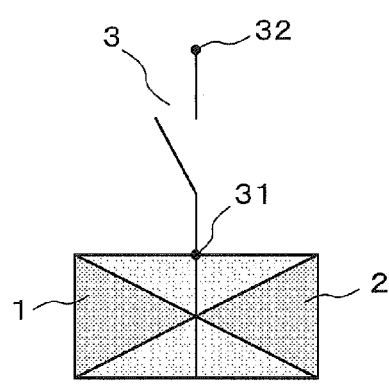
FIG. 10(A) is a circuit diagram showing an example of the semiconductor device according to the exemplary embodiment of the present invention.
Figure 10B:
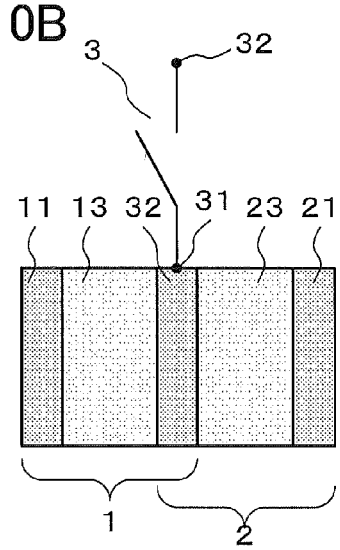
FIG. 10(B) is a cross section view showing an example of the semiconductor device according to the exemplary embodiment of the present invention.
Figure 11:
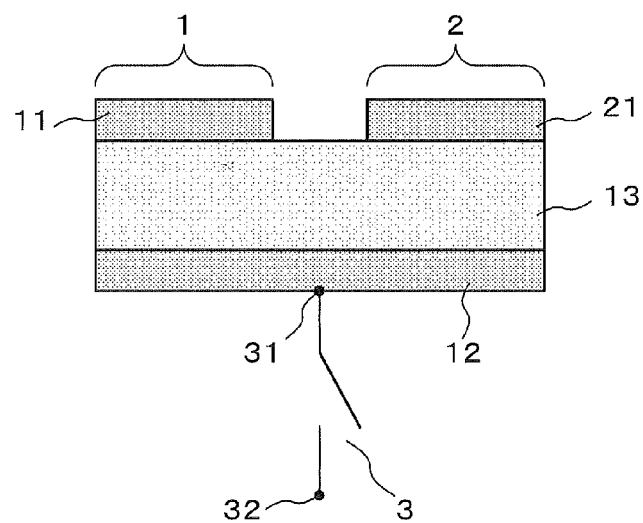
FIG. 11 is a cross section view showing an example of the semiconductor device according to the exemplary embodiment of the present invention.

FIG. 10(A) is a modified example of the semiconductor device shown in FIG. 9(A). FIG. 10(B) shows a structure of the semiconductor device, while FIG. 10(A) shows a circuit diagram of the semiconductor device. As shown in FIG. 10(A), it is possible to unify the second electrode 12 of the first switching element 1 and the second electrode 22 of the second switching element 2. By the constitution, it is possible to miniaturize the semiconductor device, and to reduce transmission loss of a control signal. As long as the second electrodes are electrically connected each other, it is also possible to unify the ion conductor 13 of the first switching element 1 and the ion conductor 23 of the second switching element 2 as shown in FIG. 11, for example.

<Fifth Exemplary Embodiment>

(Programming Method of Switching Element)

Figure 12:
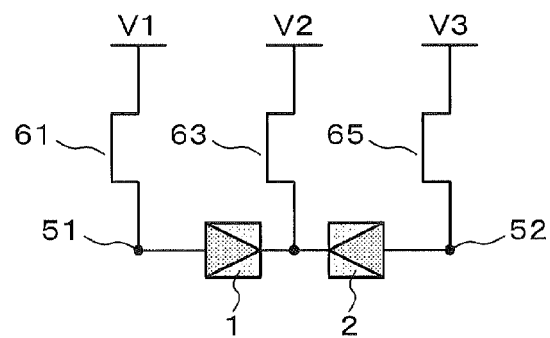
FIG. 12 is a circuit diagram showing an example of the semiconductor device according to the exemplary embodiment of the present invention.

The method for programming the switching element according to the fourth exemplary embodiment will be described below. FIG. 12 is a schematic diagram showing a semiconductor device according to a fifth exemplary embodiment. The semiconductor device shown in FIG. 12 has a constitution in which the second electrodes of the first and the second switching elements instead of the first electrodes thereof are electrically connected each other in the semiconductor device shown in FIG. 6. As shown in FIG. 12, the second electrode of the first switching element 1, the second electrode of the second switching element 2, and the drain of the first transistor 63 are electrically connected each other. Moreover, the drain of the second transistor 61 is electrically connected to the first electrode 11 of the first switching element 1. And the drain of the third transistor 65 is electrically connected to the first electrode 21 of the second switching element 2. The method for programming of the switching element is the same as that described in FIG. 6.

<Sixth Exemplary Embodiment>

(Rewriting Circuit 1 Using P Type MIS and N Type MIS)

Figure 13:
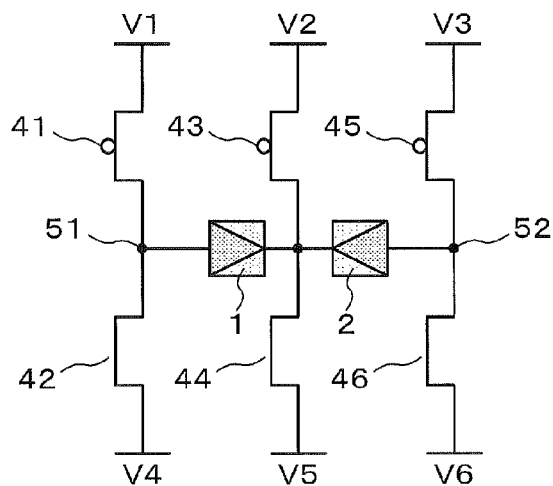
FIG. 13 is a circuit diagram showing an example of the semiconductor device according to the exemplary embodiment of the present invention.

FIG. 13 is a schematic diagram showing a semiconductor device according to a sixth exemplary embodiment. The semiconductor device shown in FIG. 13 has a constitution in which the second electrodes of the first and the second switching elements instead of the first electrodes thereof are electrically connected each other in the semiconductor device shown in FIG. 7. As shown in FIG. 13, the second electrode of the first switching element 1, the second electrode of the second switching element 2, the drain of the first P type MIS transistor 43, and the drain of the first N type MIS transistor 44 are electrically connected each other. The drain of the second P type MIS transistor 41 and the drain of the second N type MIS transistor 42 are electrically connected to the first electrode 11 of the first switching element 1. The drain of the third P type MIS transistor 45 and the drain of the third N type MIS transistor 46 are electrically connected to the first electrode 21 of the second switching element 2. According to the constitution which the second electrodes are connected each other, it is possible to improve the disturb failure and to realize the semiconductor device, which has high reliability and can perform low-voltage operation, similarly to the constitution in which the first electrodes are connected each other.

As the typical MIS transistor, a MOS (Metal Oxide Semiconductor) transistor can be used. And, it is possible to obtain intended performance by connecting the P type MOS transistor to a power supply, and grounding the N type MOS transistor. For example, if the N type MOS transistor is connected to the power source, a source of the transistor becomes floating, and consequently the performance is degraded.
(Rewriting Circuit 2 Using P Type MIS and N Type MIS)

Figure 14:
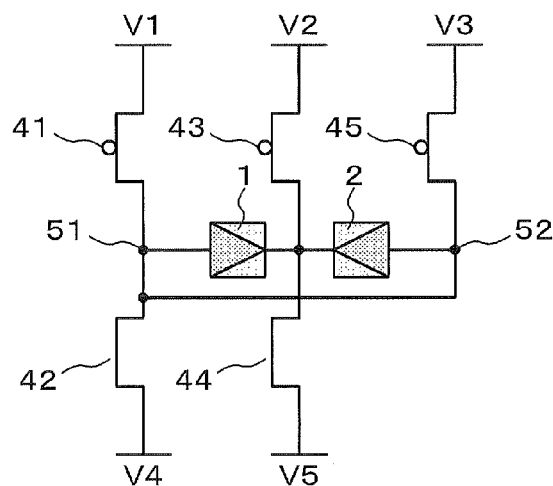
FIG. 14 is a circuit diagram showing an example of the semiconductor device according to the exemplary embodiment of the present invention.

A semiconductor device shown in FIG. 14 has a constitution in which the third N type MIS transistor 46 is omitted and the drain of the second N type MIS transistor 42 is electrically connected to both of the first electrode 11 of the first switching element 1 and the first electrode 21 of the second switching element 2.

As shown in FIG. 14, the second electrode of the first switching element 1, the second electrode of the second switching element 2, the drain of the first P type MIS transistor 43 and the drain of the first N type MIS transistor 44 are electrically connected each other. The drain of the second N type MIS transistor 42 is connected to both of the first electrode 11 of the first switching element 1 and the first electrode 12 of the second switching element 2. Furthermore, the drain of the second P type MIS transistor 41 and the drain of the second N type MIS transistor 42 are electrically connected to the first electrode 11 of the first switching element 1. The drain of the third P type MIS transistor 45 is electrically connected to the first electrode 22 of the second switching element 2.

By the constitution, the number of the transistors becomes smaller than that of the semiconductor device shown in FIG. 13, and it is possible to realize the fine and simple semiconductor device.

Similarly, it is also possible to omit the second N type MIS transistor 42, and to electrically connect the drain of the third N type MIS transistor 46 to both of the first electrode 11 of the first switching element 1 and the first electrode 21 of the second switching element 2.

As the typical MIS transistor, a MOS (Metal Oxide Semiconductor) transistor can be used.

<Seventh Exemplary Embodiment>
(Structure of Crossbar Switch)

Figure 15:
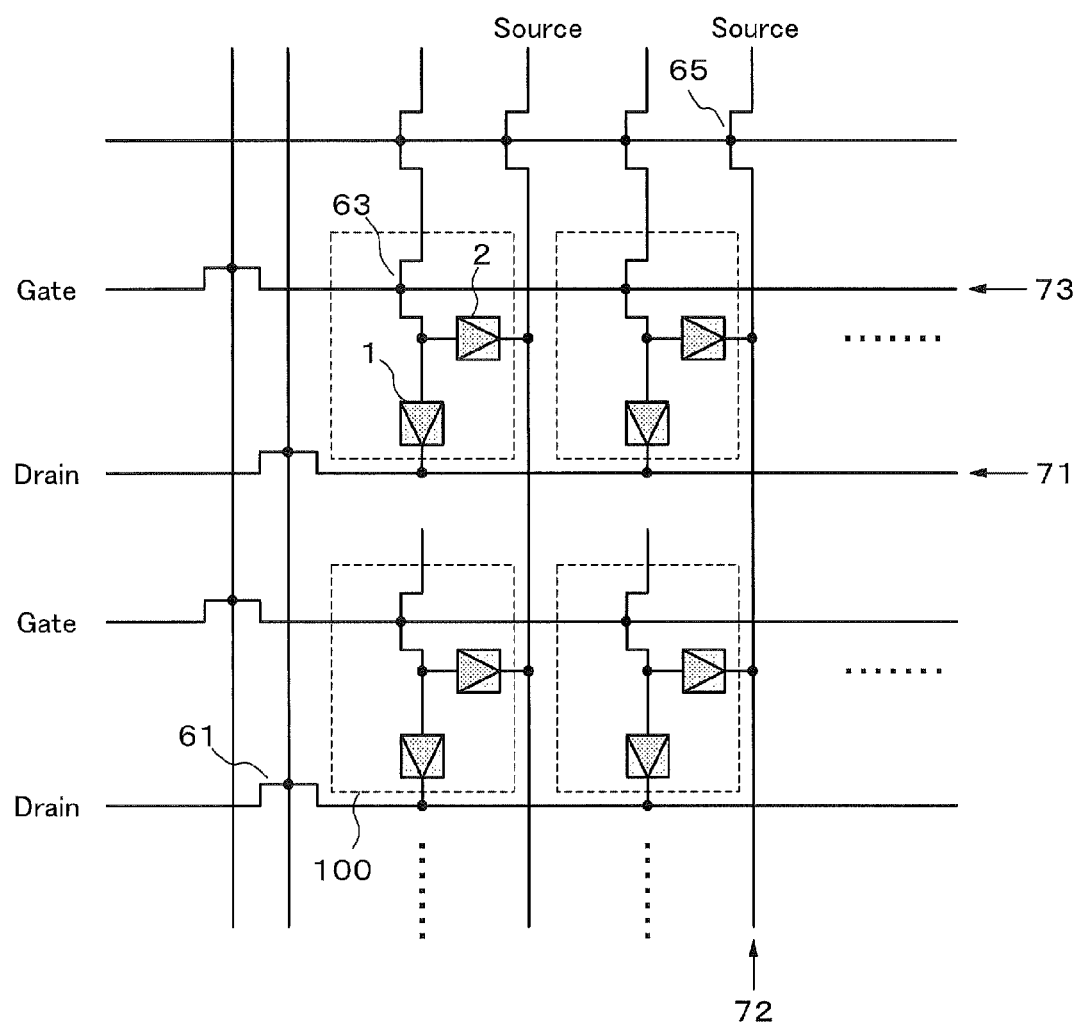
FIG. 15 is a circuit diagram showing an example of the semiconductor device according to the exemplary embodiment of the present invention.
Figure 16:
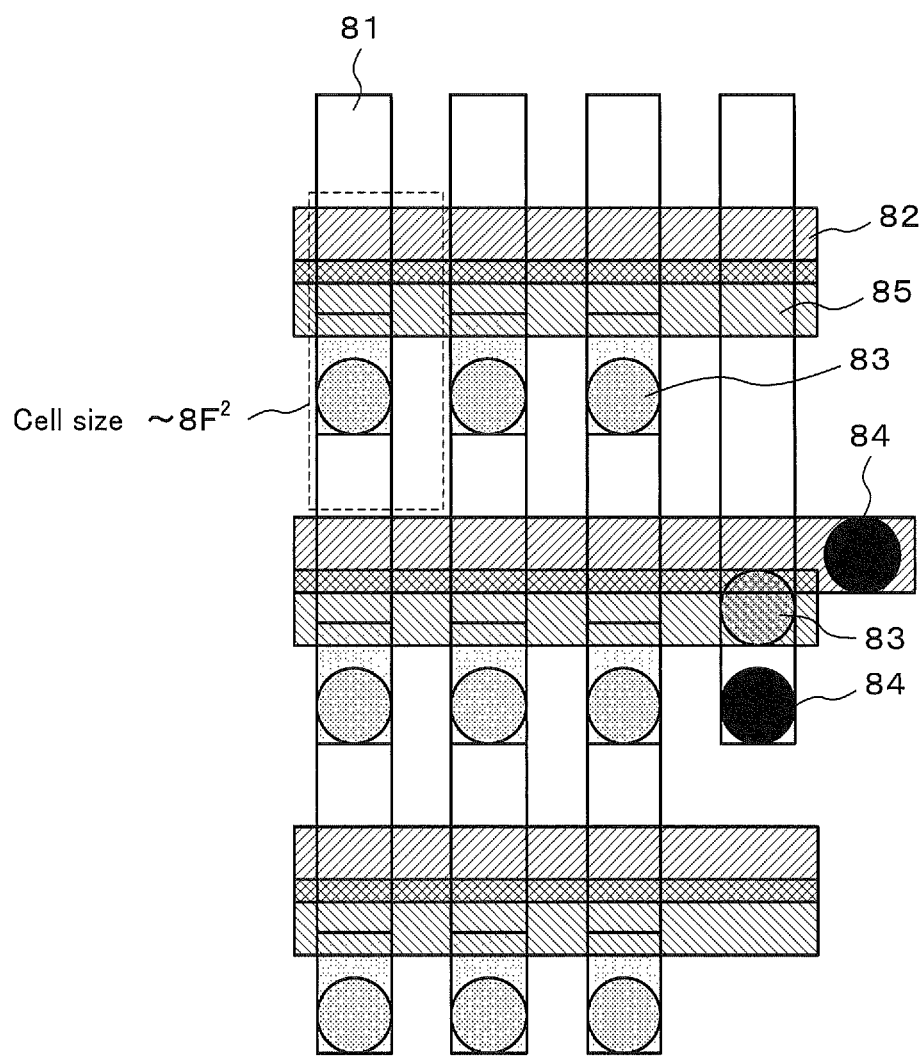
FIG. 16 is a schematic view showing an example of the semiconductor device according to the exemplary embodiment of the present invention.

FIG. 15 is a circuit diagram of a crossbar switch which uses the semiconductor device according to the present invention. FIG. 16 is a layout diagram of the crossbar switch which uses the semiconductor device according to the present invention, and is a schematic diagram showing a top view. Here, a cell according to the present invention will be defined. The cell according to the present invention is defined as a unit structure which is disposed periodically in a semiconductor integrated circuit, and includes the first switching element, the second switching element, and the first transistor as the third switching element. The crossbar switch shown in FIG. 15 has the structure that a plurality of first wirings 71 and a plurality of second wirings 72 are disposed additionally. One of first wirings 71 selected from the plurality of first wirings and a drain of a switching transistor, for example, the drain of the second transistor 61 according to the second exemplary embodiment, are electrically connected each other. One of second wirings 72 selected from the plurality of second wirings and a drain of a switching transistor, for example, the drain of the third transistor 65 according to the second exemplary embodiment, are electrically connected each other. In each of plural cells 100 which compose one column of a matrix, the second electrode of the first switching element and one of the first wirings are electrically connected each other. In each of the plural cells 100 which compose one row of the matrix, the second electrode of the second switching element and one of the second wirings are electrically connected each other. Furthermore, the crossbar switch includes a plurality of third wirings. In each of the plural cells 100 which compose one row or one column, one of the third wirings selected from the plurality of third wirings and a gate of a switching transistor, for example, the gate of the first transistor 63 according to the second exemplary embodiment, are electrically connected each other.

Figure 17:
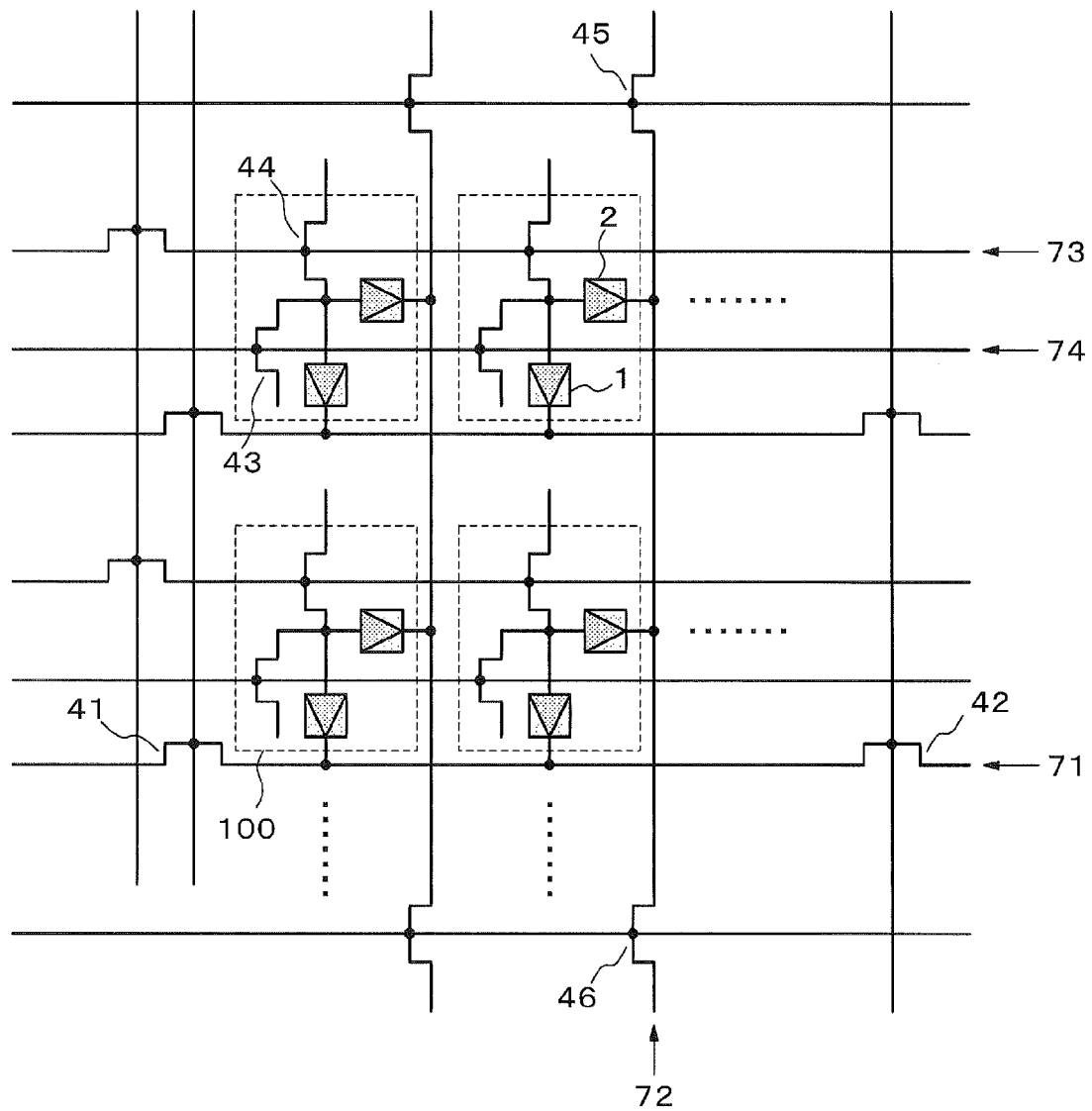
FIG. 17 is a circuit diagram showing an example of the semiconductor device according to the exemplary embodiment of the present invention.
Figure 18:
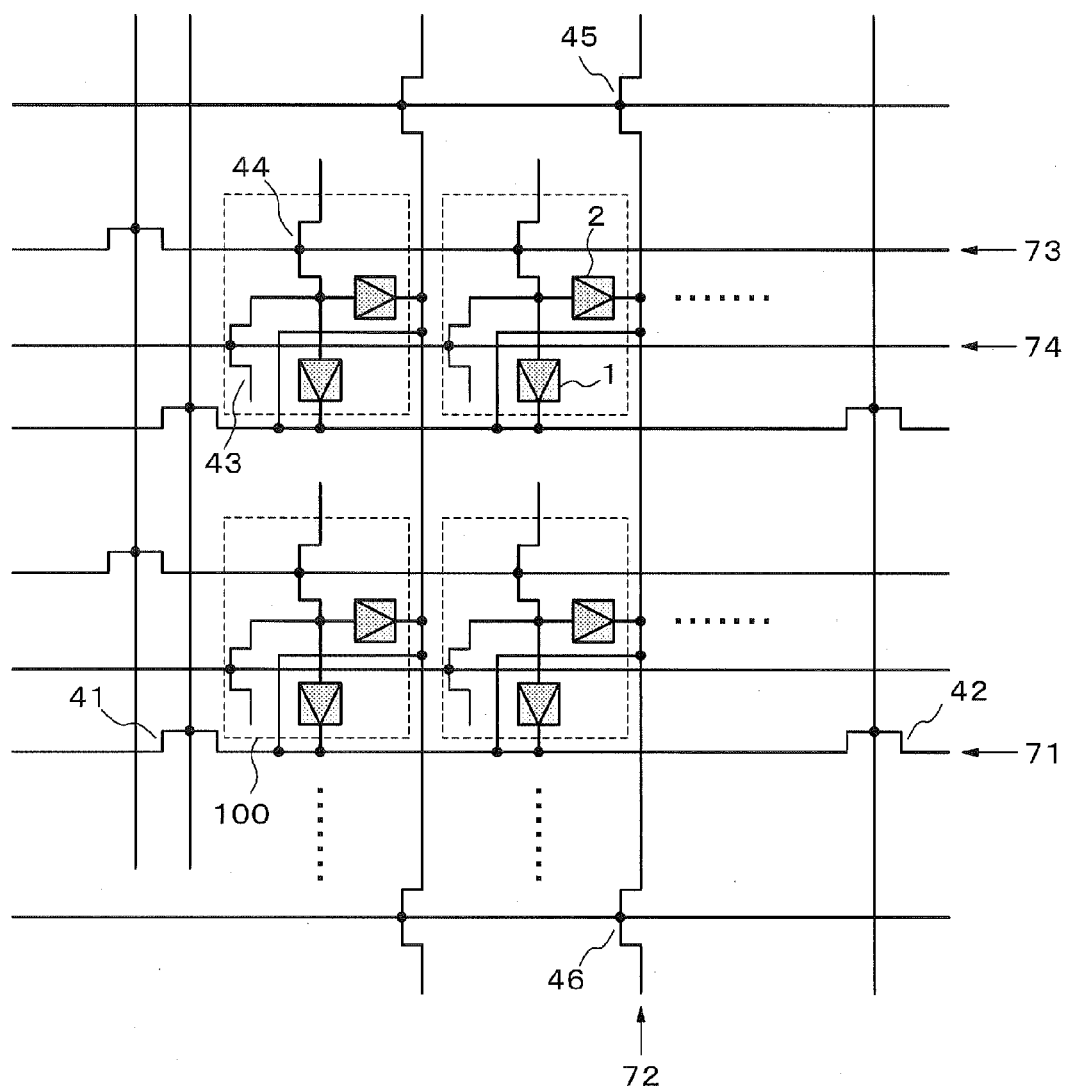
FIG. 18 is a circuit diagram showing an example of the semiconductor device according to the exemplary embodiment of the present invention.

Although a plurality of wirings which are arranged in the direction of the column are defined as the first wiring, and a plurality of wirings which are arranged in the direction of the row are defined as the second wiring according to the present exemplary embodiment, it goes without saying that a plurality of the wirings which are arranged in the direction of the row are defined as the first wiring, and a plurality of the wirings which are arranged in the direction of the column are defined as the second wiring. It is also possible to use the P type MIS transistors 41, 43 and 45 and the N type MIS transistors 42, 44 and 46 as the switching transistor as shown in FIG. 17 and FIG. 18.

By the constitution, it is possible to realize the crossbar switch which has high reliability and can perform low-voltage operation. Moreover, by using the crossbar switch which has the composition mentioned above, it becomes possible to change a signal transmission path arbitrarily after production of a semiconductor chip without consuming standby electrical power. Moreover, by installing a switching part of the crossbar switch in the multi-layered wiring layer, the switching part can be disposed in a small area, therefore, it is possible to reduce charge and discharge current when transmitting a signal, and thereby it is also advantageous for reducing the operating electrical power. Furthermore, once the crossbar switch is programmed, it can transmit the signal by using an operating voltage of the logic circuit, and thereby it is possible to perform low-voltage operation.

Figure 19:
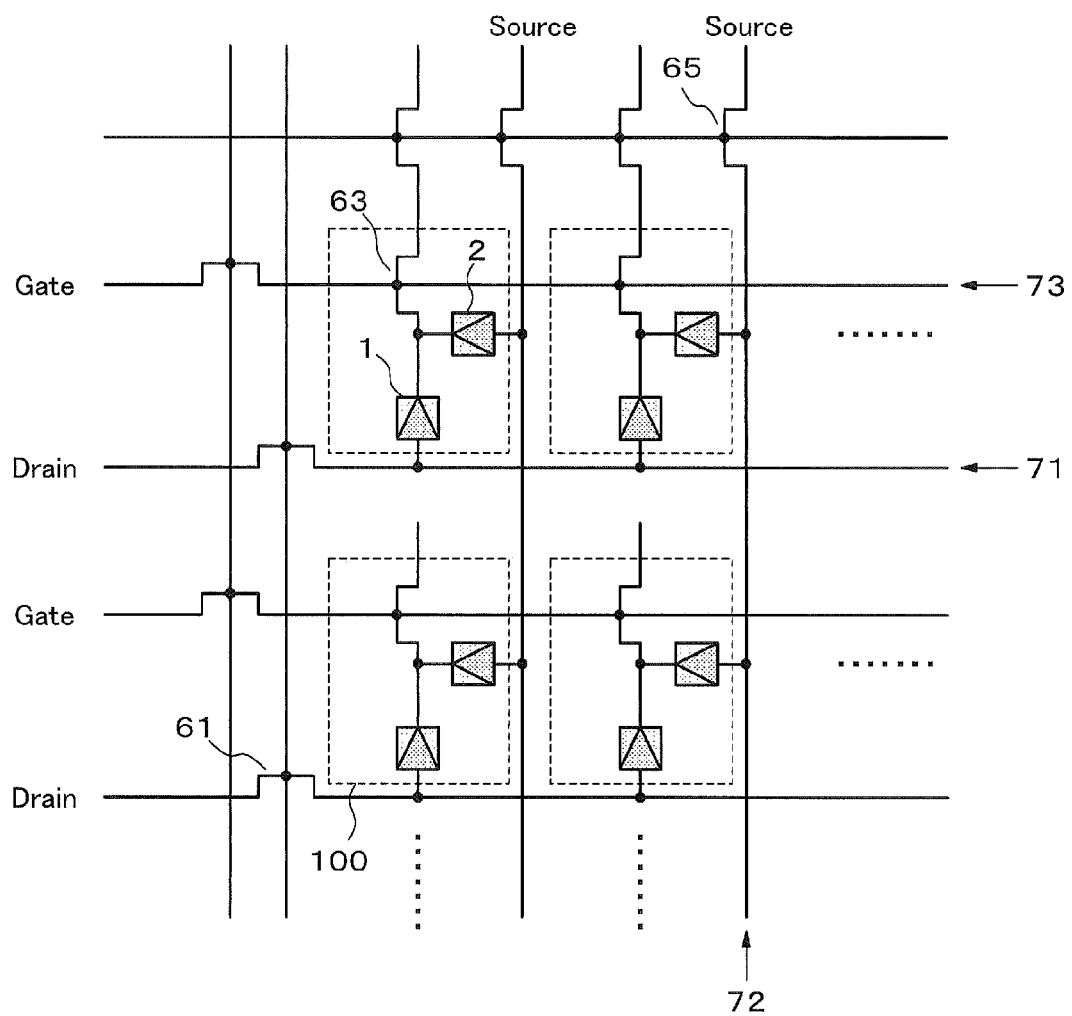
FIG. 19 is a circuit diagram showing an example of the semiconductor device according to the exemplary embodiment of the present invention.
Figure 20:
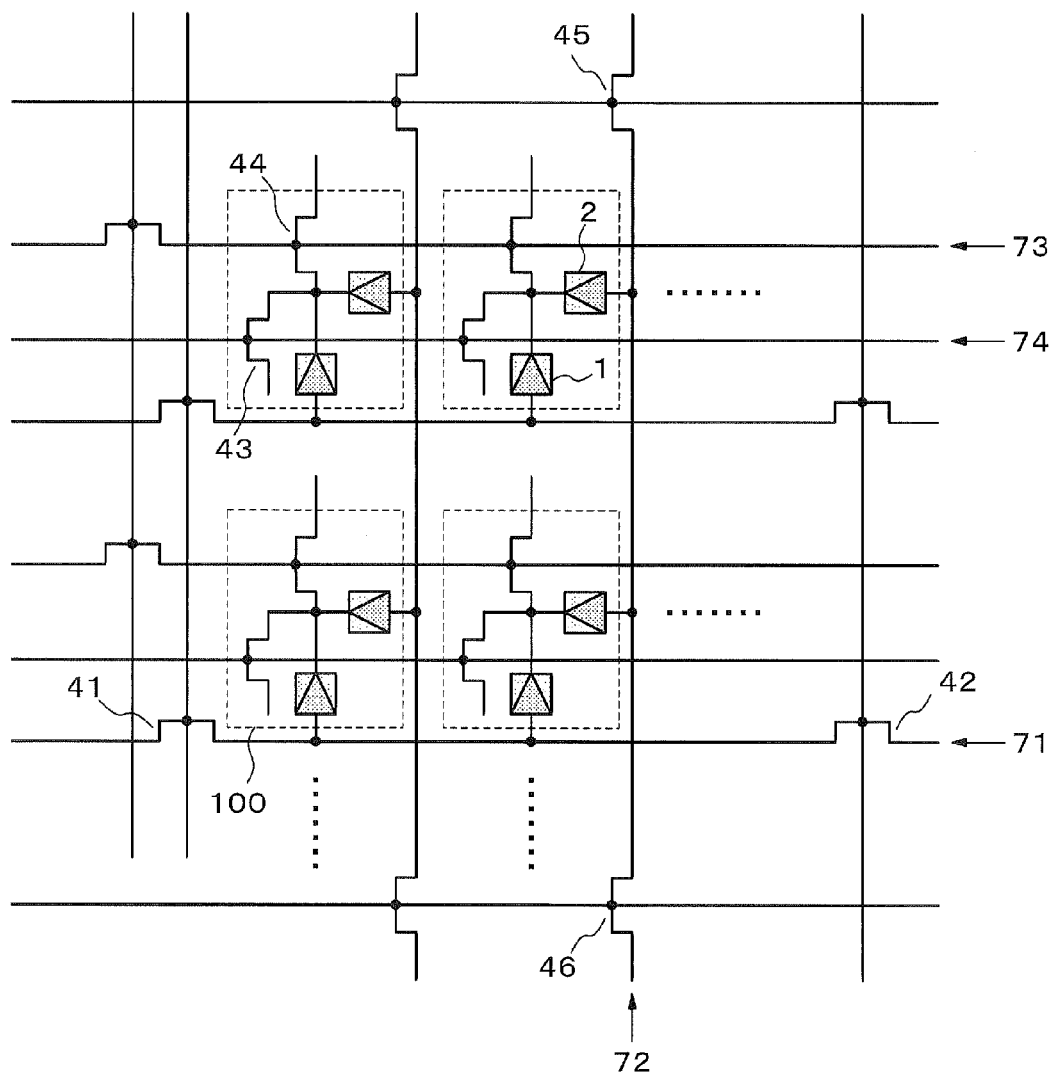
FIG. 20 is a circuit diagram showing an example of the semiconductor device according to the exemplary embodiment of the present invention.
Figure 21:
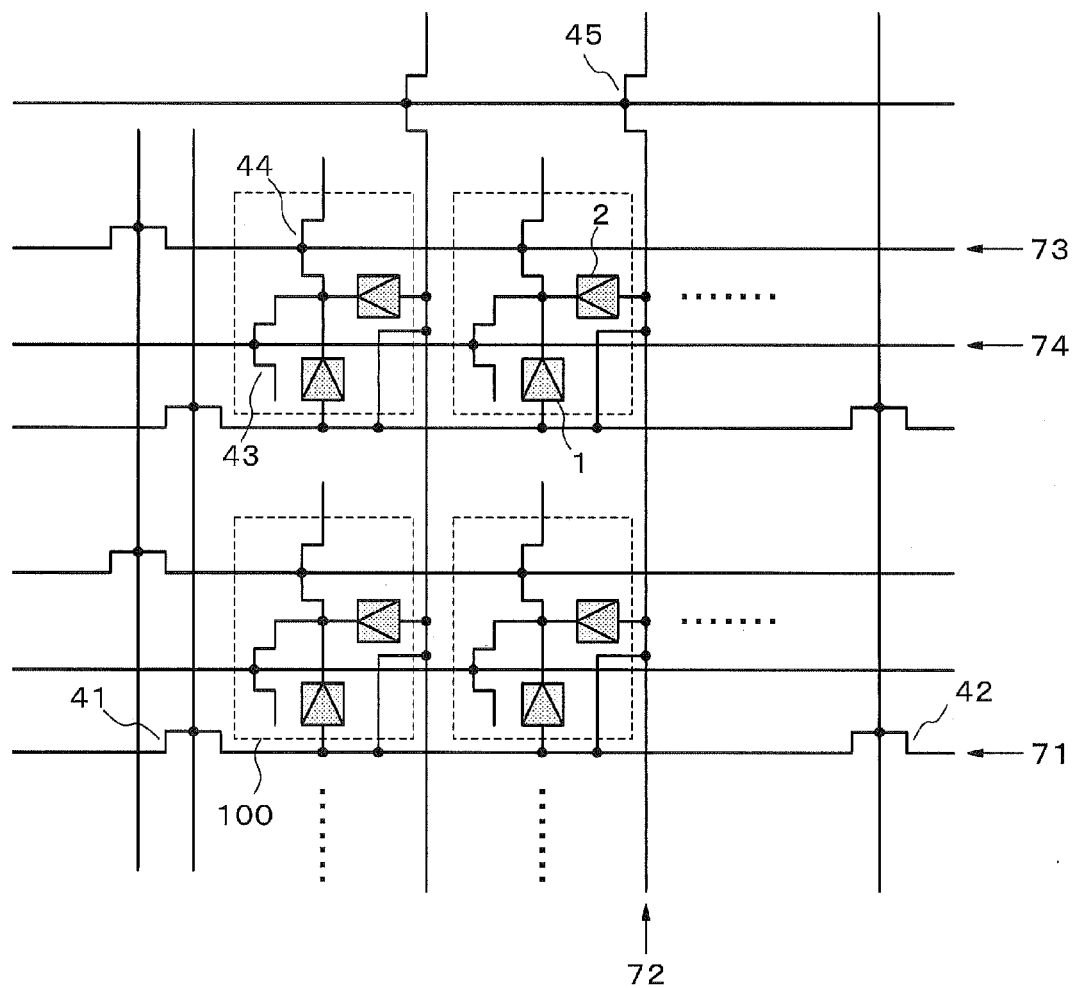
FIG. 21 is a circuit diagram showing an example of the semiconductor device according to the exemplary embodiment of the present invention.

As shown in FIGS. 19 to 21, even though the second electrodes of the first switching element and the second switching element are electrically connected each other, it is possible to compose a crossbar switch similar to the structure which is applied in the case that the first electrodes of the first switching element and the second switching element are electrically connected each other.

<Eighth Exemplary Embodiment>
(Structure of Device Whose First Electrodes (Active Electrodes) are Connected Each Other)

In the present exemplary embodiment, a structure will be described which is used for realizing the semiconductor device according to the first exemplary embodiment in the multi-layered wiring layer, that is, a structure of a semiconductor device in which the first electrodes (active electrodes) of a two-switching element are electrically connected each other. Here, each first electrode of the two-switching elements is the active electrode.

Figure 22:
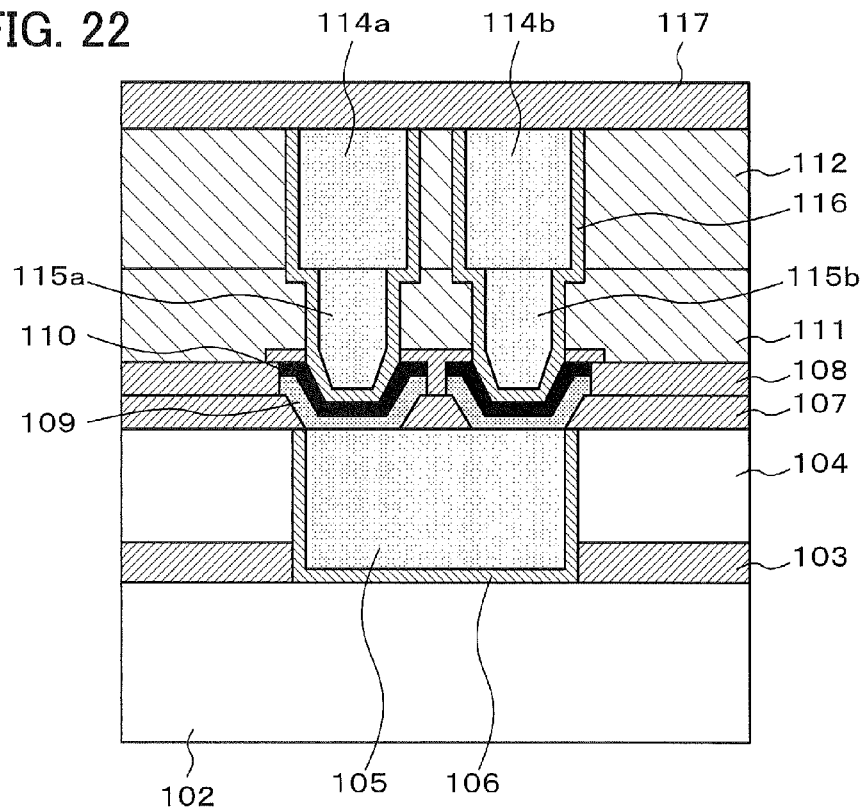
FIG. 22 is a cross section view showing an example of the semiconductor device according to the exemplary embodiment of the present invention.

FIG. 22 is a cross section view showing the semiconductor device according to the present exemplary embodiment schematically. The semiconductor device shown in FIG. 22 has the structure in which two switching elements according to the first exemplary embodiment are disposed in the multi-layered wiring layer mounted on a semiconductor substrate. That is, the semiconductor device shown in FIG. 22 includes an interlayer insulating film 102, a barrier insulating film 103, an interlayer insulating film 104, a second electrode 105, a barrier metal 106, an insulative barrier film 107, a protective insulating film 108, an ion conductor 109, a first electrode 110, interlayer insulating films 111 and 112, wirings 114a and 114b, plugs 115a and 115b, a barrier metal 116, and a barrier insulating film 117.

Each switching element has the first electrode 105, the second electrode 110 and the ion conductor 109 which is interposed between the first electrode 105 and the second electrode 110. A single first electrode 105 is formed by unifying the first electrodes of two switching elements. In the multi-layered wiring layer, the first electrode 105 is a wiring combining a lower electrode, and the ion conductor 109 has contact with the lower electrode and wiring 105 at an opening of the barrier film 107. The second electrode 110, which is an upper electrode, is electrically connected to the two separate wirings 114a and 114b through the two separate plugs 115a and 115b respectively.

By the constitution mentioned above, it is possible to eliminate the imperfection due to the erroneous operation of the semiconductor circuit, and to realize the semiconductor device which has high reliability and can perform low-voltage operation, as shown in the exemplary embodiment. In the present exemplary embodiment, a material which becomes the source of a metal ion, for example, Cu-based material is available for the first electrode. In the present exemplary embodiment, a material which is less susceptible to ionization than the second electrode, for example, Ru or Pt is applicable to the second electrode. In the exemplary embodiment, a material which can conduct the metal ion, for example, a material which includes any one of an organic matter, organosiloxane, silicon carbide oxide, tantalum silicon oxide, tantalum oxide, zirconium oxide, hafnium oxide, silicon oxide and titanium oxide is available for the ion conducting layer. Here, Cu-based means that a Cu content rate is not smaller than 95%. Generally, in the case that the Cu content rate becomes not larger than 95%, a wiring resistance increases.

<Ninth Exemplary Embodiment>

(Structure 1 of Device Whose Inactive Electrodes (Second Electrodes) are Connected Each Other)

In the present exemplary embodiment, a structure will be described which is used for realizing the semiconductor device according to the fourth exemplary embodiment in the multi-layered wiring layer, that is, a structure of a semiconductor device whose second electrodes are electrically connected each other. Here, the second electrode is the inactive electrode.

Figure 23:
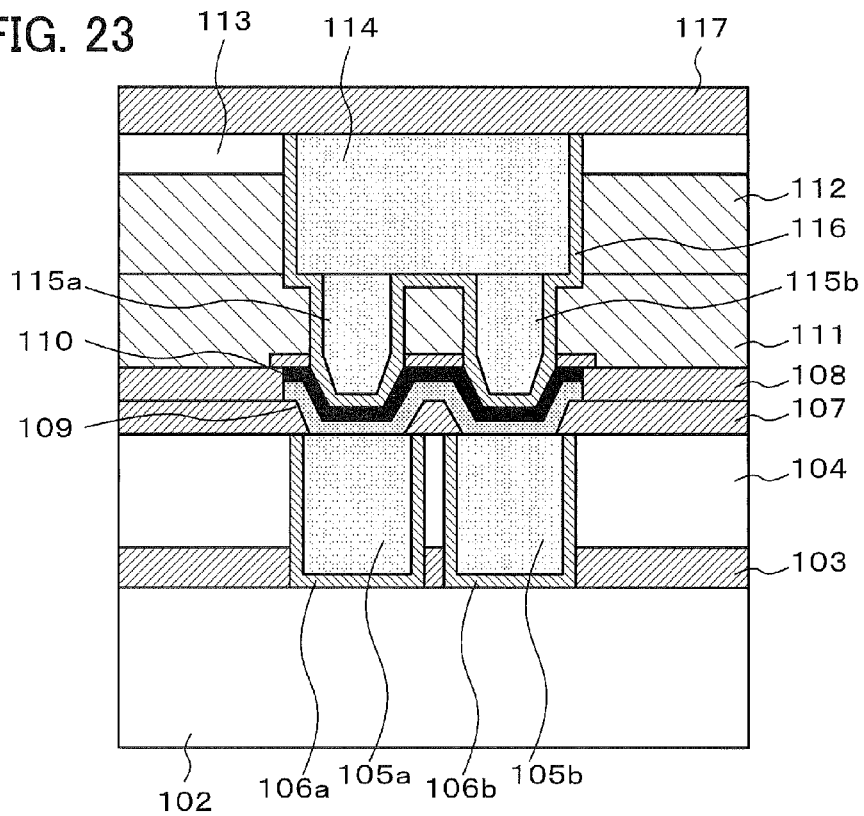
FIG. 23 is a cross section view showing an example of the semiconductor device according to the exemplary embodiment of the present invention.

FIG. 23 is a cross section view showing the semiconductor device according to the present exemplary embodiment schematically. The semiconductor device shown in FIG. 23 has the structure in which two switching elements according to the fifth exemplary embodiment are disposed in the multi-layered wiring layer which is mounted on a semiconductor substrate. That is, the semiconductor device shown in FIG. 23 includes the interlayer insulating film 102, the barrier insulating film 103, the interlayer insulating film 104, second electrodes 105a and 105b, barrier metals 106a and 106b, the insulative barrier film 107, the protective insulating film 108, the ion conductor 109, the first electrode 110, the interlayer insulating films 111 and 112, a hard mask 113 for the interlayer insulating film, a wiring 114, the plugs 115a and 115b, the barrier metal 116, and the barrier insulating film 117.

Each switching element has the first electrodes 105a and 105b, the second electrode 110, and the ion conductor 109 which is interposed between the first electrodes 105a, 105b and the second electrode 110. A single second electrode 110 is formed by unifying the second electrodes of two switching elements. In the multi-layered wiring layer, the first electrodes 105a and 105b are wirings combining lower electrodes. The ion conductor 109 has contact with the two separate lower electrode and wiring 105a and 105b at two openings of the barrier film 107. The unified second electrode 110 is an upper electrode, and is electrically connected to the wiring 114 through the two separated plugs 115a and 115b. By the constitution mentioned above, it is possible to eliminate the imperfection due to the erroneous operation of the semiconductor circuit, and to realize the semiconductor device which has high reliability and can perform low-voltage operation.

In the present exemplary embodiment, a material which becomes the source of the metal ion, for example, Cu-based material is available for the first electrode. In the present exemplary embodiment, a material which is less susceptible to ionization than the second electrode, for example, Ru or Pt is available for the second electrode. In the present exemplary embodiment, a material which can conduct the metal ion, for example, a material which includes any one of an organic matter, organosiloxane, silicon carbide oxide, tantalum silicon oxide, tantalum oxide, zirconium oxide, hafnium oxide, silicon oxide and titanium oxide is available for the ion conducting layer. Here, Cu-based means that a Cu content rate is not smaller than 95%. Generally, if the Cu content rate becomes not larger than 95%, a wiring resistance increases.

(Structure 2 of Device Whose Inactive Electrodes are Connected Each Other)

Figure 24:
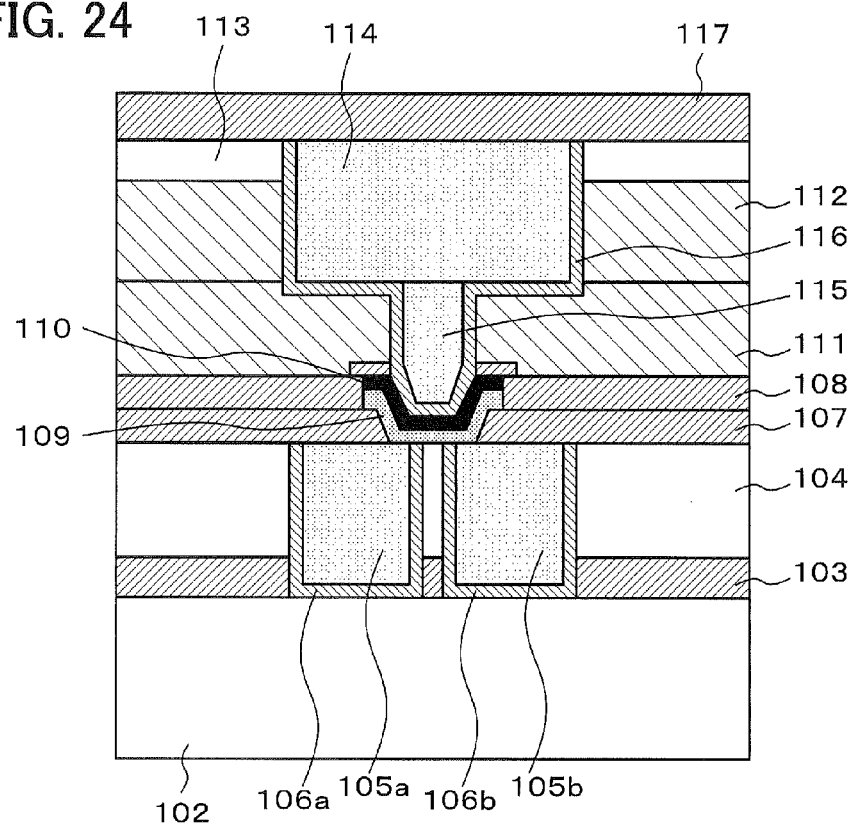
FIG. 24 is a cross section view showing an example of the semiconductor device according to the exemplary embodiment of the present invention.

FIG. 24 is a schematic diagram showing a modified example of the semiconductor device shown in FIG. 23. A semiconductor device shown in FIG. 24 has the constitution in which the ion conductor 109 has contact with the two separate lower electrode and wiring 105a and 105b at an opening of the barrier film 107 in the semiconductor device shown in FIG. 23. The second electrode 110 which is the unified upper electrode is electrically connected to the wiring 114 through the plug 115. By the constitution mentioned above, it is possible to eliminate the imperfection due to the erroneous operation of the semiconductor circuit, and to realize the semiconductor device which has high reliability and can perform low-voltage operation. Furthermore, it is possible to realize the semiconductor device which is finer than the semiconductor device shown in FIG. 23. Although the case where the first wiring and the second wiring are disposed on the same layer is described in the present exemplary embodiment, it is also possible to dispose the first wiring on one layer, and the second wiring on different layers in the multi-layered wiring layer.

EXAMPLE

The semiconductor device according to the exemplary embodiment mentioned above has been implemented in the multi-layered wiring layer, and measure results on voltage versus current properties will be shown below.

First Example

Figure 25:
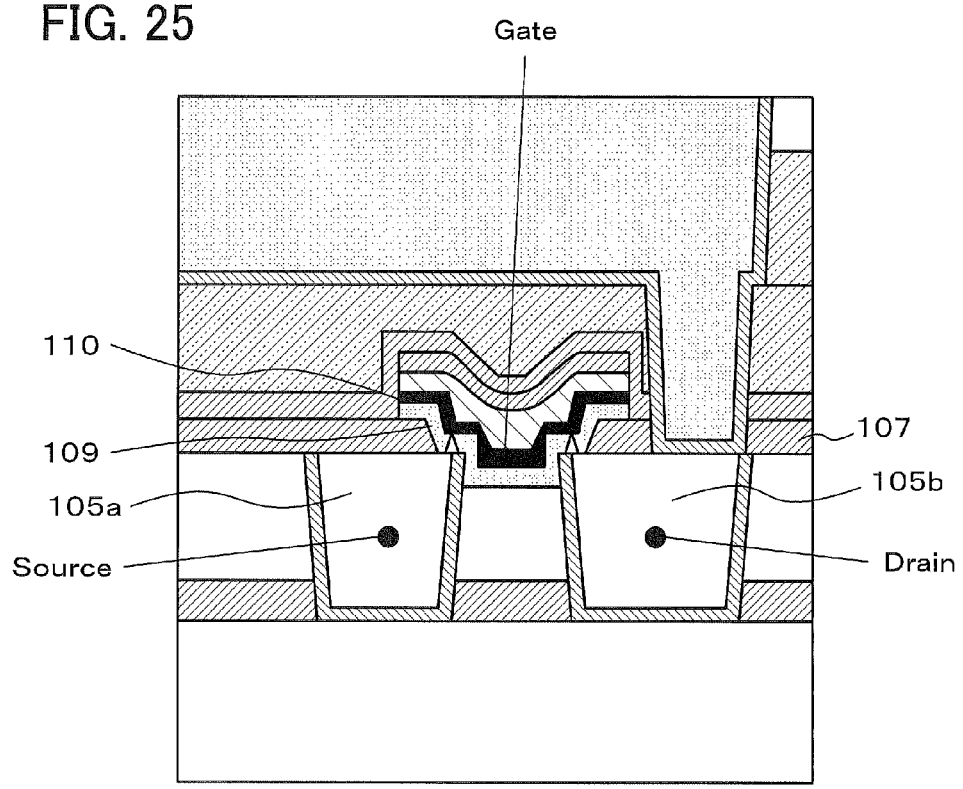
FIG. 25 is a cross section view showing an example of the semiconductor device according to examples of the present invention.

FIG. 25 is a cross section view schematically showing a semiconductor device according to the present example. The semiconductor device shown in FIG. 25 has the constitution in which two switching elements are disposed in a copper multi-layered wiring layer mounted on a semiconductor substrate. Each switching element has the first electrodes 105a and 105b, the second electrode 110, and the ion conductor 109 which is interposed between the first electrodes 105a, 105b and the second electrode 110. The second electrodes of the two switching elements are unified. In the multi-layered wiring layer, the first electrodes 105a and 105b are wirings combining lower electrodes. The ion conductor 109 has contact with the two separated lower electrodes and wirings 105a and 105b at an opening of the barrier film 107.

In the present example, the first electrode is composed of Cu-based material, Ru is utilized for the second electrode, and Polymer Solid Electrolyte (PSE) is utilized for the ion conductor. Here, Cu-based means that a Cu content rate is not smaller than 95%. Comparing each terminal shown in FIG. 25 with the writing circuit shown in FIG. 12, the terminal 51 corresponds to a Source, the terminal 52 corresponds to a Drain, and the control voltage terminal V2 corresponds to a Gate. Here, the control voltage terminal V2 corresponds to the situation that the control transistor 63 is always in the ON state.

FIG.26A-26C show voltage versus current properties which is obtained in applying the voltage to each terminal. Since the switching element is in the state of high electrical resistance at the initial state, an electrical resistance value between Source and Drain indicates $10^8$ Ω (OFF1 in FIG. 26(C)). Next, the voltages are applied between Gate and Drain, and between Gate and Source respectively in order to make the switching element transit to the state of low electrical resistance. At this time, if Gate is fixed to the ground, the forming operation can be carried out by applying positive voltages to Source and Drain respectively (Igs and Igd in FIG. 26(A)). At this time, the threshold voltage is equal to 2 V. The set current is controlled to be 100 μA by the transistor.

Next, measuring the voltage versus current characteristics between Source and Drain in order to check whether the switching element transits to the state of low electrical resistance, the measured results indicate about 600Ω (ON in FIG. 26(C)). Next, in order to make the switching element transit to the state of high electrical resistance, the voltages are applied between Gate and Drain, and between Gate and Source respectively. At this time, if Source and Drain are fixed to the ground, the reset operation can be carried out by applying a positive voltage to Gate (Igs and Igd in FIG. 26(B)). When the voltage is applied, the electrical current decreases around 1 V, that is, the electrical resistance value increases.

Next, measuring the voltage versus current characteristics between Source and Drain in order to check whether the switching element transits to the state of high electrical resistance, the measured results indicate about $10^8$Ω (OFF2 in FIG. 26(C)). As mentioned above, it can be confirmed that by applying the voltage to Gate the transition to the state of high electrical resistance (OFF1 and OFF2 in FIG. 26(C)) and to the state of low electrical resistance (ON in FIG. 26(C)) can be performed with non-volatility.

Next, the reliability, that is, the disturb characteristic is measured. FIG. 27A-27B show the voltage versus current characteristics of the switching element with the state of high electrical resistance at 125° C. FIG. 27(A) shows current values (Ids) when applying the voltage between Drain and Source. It is understood that the insulation breakdown occurs at about 4 V. FIG. 27(B) shows current values (Igs) when applying the voltage between Gate and Source. It is understood that the switching element transits to the state of low electrical resistance at about 2 V. Accordingly, it is understood that the reliability is improved because the breakdown voltage between Drain and Source becomes larger than the programming voltage.

Here, the points, to consider when improving the reliability, that is, the disturb properties will be described below. In order to secure the reliability on the insulation between Drain and Source, it is preferable that the electrical insulation resistance between Gate and Source is as equal as possible to that between Gate and Drain. Here, the electrical insulation resistance means OFF electrical resistance. The reason is as follows: If electrical resistance values are different each other, the distribution of the applied voltages becomes out of balance, and consequently there is a possibility that a high voltage is applied to one side. That is, it is preferable to form the opening in the center between Drain and Source as far as possible.

FIG. 28 is a diagram showing the comparison between the operation properties of the two terminal type element according to the background art and the operation properties of the semiconductor device according to the present example. The two terminal type element according to the background art means a semiconductor device which includes one switching element. Comparing the operation properties of two terminal type element according to the background art with the operation properties of the semiconductor device according to the present example, it is understood that the life prediction at 1 V increases from 10 years and over to not shorter than one million years. Although the present invention is described in association with some preferable examples, these exemplary embodiments and the examples are used merely for explaining the present invention by exemplifying the actual example, and are not meant to limiting the present invention.

While the example, in which the switching element is disposed in the copper multi-layered wiring mounted on the semiconductor substrate, is described in the detailed description of the present invention, thought of the present invention is not limited to this. The present invention is applicable to, for example, semiconductor products which include memory circuits such as DRAM (Dynamic Random Access Memory), SRAM (Static Random Access Memory), the flash memory, FRAM (Ferro Electric Random Access Memory), MRAM (Magnetic Random Access Memory), and bipolar transistors, a semiconductor products which include logic circuits such as the microprocessor, or the copper wiring of a board or a package which mounts those semiconductor products.

Moreover, the present invention is applicable to joining an electronic circuit device, an optical circuit device, a quantum circuit device, a micromachine, MEMS (Micro Electro Mechanical Systems) and the like to the semiconductor device. While the example using as the switching function is mainly described in the present invention, the present invention is also applicable to a memory element which uses both of the non-volatility properties and the variable resistance properties, and the like.

The whole or part of the exemplary embodiments or the examples disclosed above can be described as, but not limited to, the following supplementary note.

(Supplementary Note 1)

A semiconductor device, comprising a first switching element, a second switching element, and at least one third switching element;

wherein the third switching element comprises a first terminal and a second terminal, wherein each of the first switching element and the second switching element comprises an ion conductor, a first electrode which is disposed so as to have contact with the ion conductor and whose main component is Cu, and a second electrode which is disposed so as to have contact with the ion conductor and which comprises Ru or Pt; and wherein (a) the first electrode of the first switching element and the first electrode of the second switching element are electrically connected each other, and the first terminal of the third switching element is electrically connected to only the first electrodes which are connected each other or (b) the second electrode of the first switching element and the second electrode of the second switching element are electrically connected each other, and the first terminal of the third switching element is electrically connected to only the second electrodes which are connected each other.

Although it is apparent after reading the present specification that a person skilled in the art easily carries out various changes and various modifications by use of equivalent elements and arts, is apparent that those changes and the modifications correspond to the real scope and spirit of the attached claims.

This application is based upon and claims the benefit of priority from Japanese Patent Application No. 2010-136988, filed on Jun. 16, 2010, the disclosure of which is incorporated herein in its entirety by reference.

DESCRIPTION OF THE CODES 1 first switching element
2 second switching element
3 first transistor
11, 21 first electrode
12, 22 second electrode
13, 23 ion conductor
41 second P type MIS transistor
42 second N type MIS transistor
43 first P type MIS transistor
44 first N type MIS transistor
45 third P type MIS transistor
46 third N type MIS transistor
51, 52 input-output terminal
61 second transistor
63 first transistor
65 third transistor
71 first wiring
72 second wiring
73 third wiring
74 fourth wiring
81 upper layer wiring
82 lower layer wiring
83 via plug
84 contact plug
85 upper electrode
100 cell
102 interlayer insulating film
103 barrier insulating film
104 interlayer insulating film
105, 105a, 105b second electrode (wiring and lower electrode)
106, 106a, 106b barrier metal
107 insulative barrier film
108 protective insulating film
109 ion conductor
110 first electrode (upper electrode)
111, 112 interlayer insulating film
113 hard mask for interlayer insulating film
114, 114a, 114b wiring
115, 115a, 115b plug
116 barrier metal
117 barrier insulating film

The invention claimed is:

1. A semiconductor device, comprising:
a first switching element;
a second switching element; and
at least one third switching element;
wherein the third switching element comprises a first terminal and a second terminal,
wherein each of the first switching element and the second switching element comprises a bipolar-type switching element, which comprises an ion conductor, a first electrode which is disposed so as to have contact with the ion conductor and supplies metal ions to the ion conductor, and a second electrode which is disposed so as to have contact with the ion conductor and is less susceptible to ionization than the first electrode,
wherein the first switching element and the second switching element are connected in series with opposite polar direction, and
wherein
(a) the first electrode of the first switching element and the first electrode of the second switching element are electrically connected to each other, and the first terminal of the third switching element is electrically connected to only the first electrodes which are electrically connected to each other, or
(b) the second electrode of the first switching element and the second electrode of the second switching element are electrically connected to each other, and the first terminal of the third switching element is electrically connected to only the second electrodes which are electrically connected to each other.

2. The semiconductor device according to claim 1, wherein the third switching element comprises a first transistor,
the first transistor comprises a source, a drain and a gate,
the first terminal of the third switching element is the drain of the first transistor, and
the second terminal of the third switching element is the source of the first transistor.

3. The semiconductor device according to claim 1, further comprising:
a first wiring; and
a second wiring,
wherein in the case of (a), a second electrode of the first switching element and the first wiring are electrically connected to each other, a second electrode of the second switching element and the second wiring are electrically connected to each other, in the case of (b), a first electrode of the first switching element and the first wiring are electrically connected to each other, a first electrode of the second switching element and the second wiring are electrically connected to each other, the first wiring and the second wiring are disposed on one wiring layer of semiconductor multi-layered wiring layers, and
wherein the first switching element and the second switching element are disposed in the multi-layered wiring layers and between the one wiring layer and a wiring layer which is disposed directly above or below the one wiring layer.

4. The semiconductor device according to claim 1, further comprising:
a first wiring; and
a second wiring,
wherein:
in the case of (a), a second electrode of the first switching element and the first wiring are electrically connected to each other, and the second electrode of the second switching element and the second wiring are electrically connected to each other,
in the case of (b), a first electrode of the first switching element and the first wiring are electrically connected to each other, and a first electrode of the second switching element and the second wiring are electrically connected to each other,
the first wiring is disposed on one wiring layer of semiconductor multi-layered wiring layers,
the second wiring is disposed on a wiring layer which is disposed directly above or below the one wiring layer, and
the first switching element and the second switching element are disposed in the multi-layered wiring layers and between the one wiring layer and a wiring layer which is disposed directly above or below the one wiring layer.

5. The semiconductor device according to claim 1, wherein the first wiring is disposed on one wiring layer of semiconductor multi-layered wiring layers, the second wiring is disposed on a wiring layer which is disposed directly above or below the one wiring layer, and
wherein the first switching element and the second switching element are disposed in the multi-layered wiring layer and between the one wiring layer and the wiring layer which is disposed directly above or below the one wiring layer.

6. The semiconductor device according to claim 1, wherein the ion conductor is composed of any one of an organic matter, organosiloxane, silicon carbide oxide, tantalum silicon oxide, tantalum oxide, zirconium oxide, hafnium oxide, silicon oxide, and titanium oxide, the first electrode is composed mostly of copper, and the second electrode is composed of one of Ru and Pt.

7. The semiconductor device according to claim 1, further comprising:
a first transistor;
a second transistor; and
a third transistor,
wherein the third switching element comprises the first transistor, each of the first to the third transistors comprises a source, a drain, and a gate, the first terminal of the third switching element comprises the drain of the first transistor, the second terminal of the third switching element comprises the source of the first transistor, the drain of the first transistor is electrically connected to only the first electrodes of the first switching element and the second switching element, the drain of the second transistor and the second electrode of the first switching element are electrically connected to each other, the drain of the third transistor and the second electrode of the second switching element are electrically connected to each other, the sources of the first to the third transistors are connected to a power supply or are grounded, and a control signal is inputted into the gates of the first to the third transistors.

8. The semiconductor device according to claim 7, further comprising:
a cell which comprises the first switching element, the second switching element, the third switching element, a plurality of first wirings, a plurality of second wirings, and a plurality of third wirings,
wherein, in the cell, a first electrode of the first switching element and a first electrode of the second switching element are electrically connected to each other, and a first terminal of the third switching element is electrically connected to only the first electrodes which are electrically connected to each other, the plurality of the cells are disposed in a form of a matrix, and one first wiring selected from the plurality of first wirings and the drain of the second transistor are electrically connected to each other, and one second wiring selected from the plurality of second wirings and the drain of the third transistor are electrically connected to each other, in each of the plural cells which compose one column of the matrix, the second electrode of the first switching element and the one first wiring are electrically connected to each other, in each of the plural cells which compose one row of the matrix, the second electrode of the second switching element and the one second wiring are electrically connected to each other, in each of the plural cells which compose one row or one column, one third wiring selected from the plurality of third wirings and the gate of the first transistor are electrically connected to each other.

9. The semiconductor device according to claim 8, wherein the first wiring and the second wiring are disposed on one wiring layer of semiconductor multi-layered wiring layers, and the first switching element and the second switching element are disposed in the multi-layered wiring layers and between the one wiring layer and a wiring layer which is disposed directly above or below the one wiring layer.

10. The semiconductor device according to claim 1, further comprising:
two third switching elements;
first to third P type MIS transistors; and
first to third N type MIS transistors,
wherein one of the third switching elements comprises the first P type MIS transistor, the other of the third switching elements comprises the first N type MIS transistor, a first terminal of the one third switching element comprises a drain of the first P type MIS transistor, a second terminal of the one third switching element is a source of the first P type MIS transistor, a first terminal of the other third switching element comprises a drain of the first N type MIS transistor, a second terminal of the other third switching element is a source of the first N type MIS transistor, drains of the second P type MIS transistor and the second N type MIS transistor, and the second electrode of the first switch element are electrically connected to each other, drains of the third P type MIS transistor and the third N type MIS transistor, and the second electrode of the second switching element are electrically connected to each other, sources of the first to the third P type MIS transistors are connected to a power supply, and sources of the first to the third N type MIS transistors are grounded, and a control signal is inputted into gates of the first to the third P type MIS transistors and the first to the third N type MIS transistors.

11. The semiconductor device according to claim 10, further comprising:
a cell which comprises the first switching element, the second switching element, the third switching element, a plurality of first wirings, a plurality of second wirings, a plurality of third wirings, and a plurality of fourth wirings,
wherein, in the cell, the first electrode of the first switching element and the first electrode of the second switching element are electrically connected to each other, and a first terminal of the third switching element is electrically connected to only the first electrodes which are electrically connected to each other, the plurality of cells are disposed in a form of a matrix, one end of one first wiring selected from the plurality of first wirings and a drain of the second N type MIS transistor are electrically connected to each other, the other end of the one first wiring and a drain of the second P type MIS transistor are electrically connected to each other, one end of one second wiring selected from the plurality of second wirings and a drain of the third N type MIS transistor are electrically connected to each other, the other end of the one second wiring and the drain of the third P type MIS transistor are electrically connected to each other, in each of the plural cells which compose one column of the matrix, a second electrode of the first switching element and the one first wiring are electrically connected to each other, in each of the plural cells which compose one row of the matrix, a second electrode of the second switching element and the one second wiring are electrically connected to each other, in each of the plural cells which compose one row or one column, one third wiring selected from the plurality of third wirings and a gate of the first N type MIS transistor are electrically connected to each other, and one fourth wiring selected from the plurality of fourth wirings and a gate of the first P type MIS transistor are electrically connected to each other.

12. The semiconductor device according to claim 1, further comprising:
two pieces of the third switching elements, each of the third switching elements comprising a first terminal and a second terminal;
first and second P type MIS transistors; and
first to third N type MIS transistors, one of the two third switching elements comprises the first P type MIS transistor, and the other of the two third switching elements comprises the first N type MIS transistor, the first terminal of the one third switching element is a drain of the first P type MIS transistor, and the second terminal of the one third switching element comprises a source of the first P type MIS transistor, the first terminal of the other third switching element comprises a drain of the first N type MIS transistor, and the second terminal of the other third switching element comprises a source of the first N type MIS transistor, a drain of the second N type MIS transistor and a second electrode of the first switch element are electrically connected to each other, a drain of the third N type MIS transistor and a second electrode of the second switching element are electrically connected to each other,
wherein a drain of the second P type MIS transistor is electrically connected to a second electrode of the first switching element and a second electrode of the second switching element, sources of the first and the second P type MIS transistors are connected to a power supply, and sources of the first to the third N type MIS transistors are grounded, and a control signal is inputted into the gates of the first and the second P type MIS transistors and the first to the third N type MIS transistors.

13. The semiconductor device according to claim 12, further comprising:
a cell which comprises the first switching element, the second switching element, the third switching element, a plurality of first wirings, a plurality of second wirings, a plurality of third wirings, and a plurality of fourth wirings,
wherein, in the cell, the first electrode of the first switching element and the first electrode of the second switching element are electrically connected to each other, and a first terminal of the third switching element is electrically connected to only the first electrodes which are electrically connected to each other, a plurality of the cells are disposed in a form of a matrix, one end of one first wiring selected from the plurality of first wirings and a drain of the second N type MIS transistor are electrically connected to each other, and the other end of the one first wiring and a drain of the second P type MIS transistor are electrically connected to each other, and one end of one second wiring selected from the plurality of second wirings and a drain of the third N type MIS transistor are electrically connected to each other, in each of the plural cells which compose one column of the matrix, a second electrode of the first switching element, the one first wiring, and the one second wiring are electrically connected to each other, and in each of the plural cells which compose one row of the matrix, a second electrode of the second switching element and the one second wiring are electrically connected to each other, in each of the plural cells which compose one row or one column, one third wiring selected from the plurality of third wirings and a gate of the first N type MIS transistor are electrically connected to each other, and one fourth wiring selected from the plurality of fourth wirings and a gate of the first P type MIS transistor are electrically connected to each other.

14. The semiconductor device according to claim 1, further comprising:
first to third transistors,
wherein the third switching element comprises the first transistor, each of the first to the third transistors comprises a source, a drain,. and a gate, a first terminal of the third switching element comprises the drain of the first transistor, and the second terminal of the third switching element comprises the source of the first transistor, the drain of the first transistor is electrically connected to only the second electrodes of the first switching element and the second switching element, the drain of the second transistor and a first electrode of the first switching element are electrically connected to each other, the drain of the third transistor and a first electrode of the second switching element are electrically connected to each other, the sources of the first to the third transistors are connected to a power supply or are grounded, and a control signal is inputted into the gates of the first to the third transistors.

15. The semiconductor device according to claim 14, further comprising:
a cell which comprises the first switching element, the second switching element, the third switching element, a plurality of first wirings, a plurality of second wirings, and a plurality of third wirings,
wherein, in the cell, the second electrode of the first switching element and the second electrode of the second switching element are electrically connected to each other, a first terminal of the third switching element is electrically connected to only the second electrodes which are electrically connected to each other, a plurality of the cells are disposed in a form of a matrix, one first wiring selected from the plurality of first wirings and the drain of the second transistor are electrically connected to each other, and one second wiring selected from the plurality of second wirings and the drain of the third transistor are electrically connected to each other, in each of the plural cells which compose one column of the matrix, a first electrode of the first switching element and the one first wiring are electrically connected to each other, in each of the plural cells which compose one row of the matrix, a first electrode of the second switching element and the one second wiring are electrically connected to each other, in each of the plural cells which compose one row or one column, one third wiring selected from the plurality of third wirings and a gate of the first transistor are electrically connected to each other.

16. The semiconductor device according to claim 1, further comprising:
two pieces of the third switching elements, each of the third switching elements comprising a first terminal and a second terminal;
first to third P type MIS transistors; and
first to third N type MIS transistors, wherein one of the third switching elements comprises the first P type MIS transistor, and the other of the two third switching elements comprises the first N type MIS transistor, the first terminal of the one third switching element comprises the drain of the first P type MIS transistor, the second terminal of the one third switching element comprises the source of the first P type MIS transistor, the first terminal of the other third switching element is the drain of the first N type MIS transistor, the second terminal of the other third switching element is the source of the first N type MIS transistor, the drains of the second P type MIS transistor and the second N type MIS transistor, and the first electrode of the first switch element are electrically connected to each other, a the drains of the third P type MIS transistor and the third N type MIS transistor, and a first electrode of the second switching element are electrically connected to each other, the sources of the first to the third P type MIS transistors are connected to a power supply, the sources of the first to the third N type MIS transistors are grounded, and a control signal is inputted into the gates of the first to the third P type MIS transistors and the first to the third N type MIS transistors.

17. The semiconductor device according to claim 16, further comprising:
a cell which comprises the first switching element, the second switching element, the third switching element, a plurality of first wirings, a plurality of second wirings, a plurality of third wirings, and a plurality of fourth wirings,
wherein, in the cell, the second electrode of the first switching element and the second electrode of the second switching element are electrically connected to each other, a first terminal of the third switching element is electrically connected to only the second electrodes which are electrically connected to each other, a plurality of the cells are disposed in a form of a matrix, one end of one first wiring selected from the plurality of first wirings and a drain of the second N type MIS transistor are electrically connected to each other, the other end of the one first wiring and a drain of the second P type MIS transistor are electrically connected to each other, one end of one second wiring selected from the plurality of second wirings and a drain of the third N type MIS transistor are electrically connected to each other, the other end of the one second wiring and a drain of the third P type MIS transistor are electrically connected to each other, in each of the plural cells which compose one column of the matrix, a first electrode of the first switching element and the one first wiring are electrically connected to each other, in each of the plural cells which compose one row of the matrix, a first electrode of the second switching element and the one second wiring are electrically connected to each other, in each of the plural cells which compose one row or one column, one third wiring selected from the plurality of third wirings and a gate of the first N type MIS transistor are electrically connected to each other, and one fourth wiring selected from the plurality of fourth wirings and a gate of the first P type MIS transistor are electrically connected to each other.

18. The semiconductor device according to claim 1, further comprising:
two pieces of the third switching elements, each of the third switching elements comprising a first terminal and a second terminal;
first to third P type MIS transistors; and
first and second N type MIS transistors,
wherein one of the third switching elements comprises the first P type MIS transistor, the other of the third switching elements comprises the first N type MIS transistor, the first terminal of the one third switching element comprises the drain of the first P type MIS transistor, the second terminal of the one third switching element comprises the source of the first P type MIS transistor, the first terminal of the other third switching element comprises the drain of the first N type MIS transistor, and the second terminal of the other third switching element is corresponding to the source of the first N type MIS transistor, the drain of the second P type MIS transistor and a first electrode of the first switch element are electrically connected to each other, and the drain of the third P type MIS transistor and a first electrode of the second switching element are electrically connected to each other, the drain of the second N type MIS transistor is electrically connected to the first electrode of the first switching element and the first electrode of the second switching element, the sources of the first to the third P type MIS transistors are connected to a power supply, the sources of the first and the second N type MIS transistors are grounded, and a control signal is inputted into the gates of the first to the third P type transistors and the first and the second N type MIS transistors.

19. The semiconductor device according to claim 18, further comprising:
a cell which comprises the first switching element, the second switching element, the third switching element, a plurality of first wirings, a plurality of second wirings, a plurality of third wirings, and a plurality of fourth wirings,
wherein, in the cell, the second electrode of the first switching element and the second electrode of the second switching element are electrically connected to each other, a first terminal of the third switching element is electrically connected to only the second electrodes which are electrically connected to each other, a plurality of the cells are disposed in a form of a matrix, one end of one first wiring selected from the plurality of first wirings and a drain of the second N type MIS transistor are electrically connected to each other, the other end of the one first wiring and a drain of the second P type MIS transistor are electrically connected to each other, one end of one second wiring selected from the plurality of second wirings and a drain of the third P type MIS transistor are electrically connected to each other, in each of the plural cells which compose one column of the matrix, a first electrode of the first switching element, the one first wiring, and the one second wiring are electrically connected to each other, in each of the plural cells which compose one row of the matrix, a first electrode of the second switching element and the one second wiring are electrically connected to each other, in each of the plural cells which compose one row or one column, one third wiring selected from the plurality of third wirings and a gate of the first N type MIS transistor are electrically connected to each other, and one fourth wiring selected from the plurality of fourth wirings and a gate of the first P type MIS transistor are electrically connected to each other.

20. An operation method for a semiconductor device, the semiconductor device comprising a first switching element, a second switching element, and at least one third switching element,
wherein the third switching element comprises a first terminal and a second terminal, each of the first switching element and the second switching element comprises a bipolar-type switching element, which comprises an ion conductor, a first electrode which is disposed so as to have contact with the ion conductor and supplies metal ions to the ion conductor, and a second electrode which is disposed so as to have contact with the ion conductor and is less susceptible to ionization than the first electrode, wherein the first switching element and the second switching element are connected in series with opposite polar direction, and wherein either:
(a) the first electrode of the first switching element and the first electrode of the second switching element are electrically connected to each other, and a first terminal of the third switching element is electrically connected to only the first electrodes which are electrically connected to each other, or
(b) the second electrode of the first switching element and the second electrode of the second switching element are electrically connected to each other, and a first terminal of the third switching element is electrically connected to only the second electrodes which are electrically connected to each other, the operation method for the semiconductor device comprising:
applying a predetermined voltage, which is higher than a voltage applied to the second electrodes of the first switching element and the second switching element, to the first electrodes of the first switching element and the second switching element through the third switching element, in the case of (a); and
applying a predetermined voltage, which is lower than a voltage applied to the second electrodes of the first switching element and the second switching element, to the first electrodes of the first switching element and the second switching element through the third switching element, in the case of (b).

* * * * *